United States Patent
Takagi et al.

(10) Patent No.: US 10,081,868 B2
(45) Date of Patent: Sep. 25, 2018

(54) GAS SUPPLY NOZZLE, SUBSTRATE PROCESSING APPARATUS, AND NON-TRANSITORY COMPUTER-READABLE RECORDING MEDIUM

(71) Applicant: HITACHI KOKUSAI ELECTRIC INC., Tokyo (JP)

(72) Inventors: Kosuke Takagi, Toyama (JP); Ryota Sasajima, Toyama (JP); Shintaro Kogura, Toyama (JP); Naonori Akae, Toyama (JP); Risa Yamakoshi, Toyama (JP); Toshiki Fujino, Toyama (JP); Masato Terasaki, Toyama (JP); Masayoshi Minami, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/211,583

(22) Filed: Jul. 15, 2016

(65) Prior Publication Data

US 2017/0051408 A1  Feb. 23, 2017

(30) Foreign Application Priority Data

Jul. 17, 2015 (JP) .................. 2015-142902
May 31, 2016 (JP) .................. 2016-108773

(51) Int. Cl.

| H01L 21/31 | (2006.01) |
|---|---|
| H01L 21/469 | (2006.01) |
| C23C 16/455 | (2006.01) |
| C23C 16/24 | (2006.01) |
| H01L 21/02 | (2006.01) |

(52) U.S. Cl.
CPC ........ *C23C 16/45563* (2013.01); *C23C 16/24* (2013.01); *H01L 21/0228* (2013.01); *H01L 21/02126* (2013.01); *H01L 21/02211* (2013.01)

(58) Field of Classification Search
None
See application file for complete search history.

(56) References Cited

U.S. PATENT DOCUMENTS

2008/0075838 A1* 3/2008 Inoue .................. C23C 8/10
                                                              427/58
2014/0357058 A1   12/2014 Takagi et al.

FOREIGN PATENT DOCUMENTS

| JP | 2004-006551 A | 1/2004 |
|---|---|---|
| JP | 2009-295729 A | 12/2009 |

(Continued)

OTHER PUBLICATIONS

Office Action in KR counterpart Application No. 20160082790 dated Oct. 17, 2017.

(Continued)

*Primary Examiner* — Calvin Choi
(74) *Attorney, Agent, or Firm* — Volpe and Koenig, P.C.

(57) ABSTRACT

Provided is a technology including a nozzle base end portion which is provided in a processing chamber processing a substrate to extend in a vertical direction and into which a processing gas processing the substrate is introduced, a nozzle distal end portion which is configured in a U shape and in which a gas supply hole supplying the processing gas is provided to a side surface of the substrate, and a gas residence suppressing hole which is provided in a downstream end of the nozzle distal end portion and has a diameter larger than that of the gas supply hole.

19 Claims, 15 Drawing Sheets

(56) References Cited

FOREIGN PATENT DOCUMENTS

| | | |
|---|---|---|
| JP | 2013-157491 A | 8/2013 |
| KR | 10-2008-0027199 | 3/2008 |
| KR | 10-2014-0357058 | 5/2014 |
| KR | 20140142160 A | 12/2014 |

OTHER PUBLICATIONS

Korean Office Action dated May 2, 2018 for the Korean Patent Application No. 10-2016-0082790.

* cited by examiner

REACTION RATIO INSIDE NOZZLE

REACTION RATIO INSIDE NOZZLE (φ1.1)

REACTION RATIO INSIDE NOZZLE (φ4)

REACTION RATIO INSIDE NOZZLE (φ8)

FIG. 8A     FIG. 8B     FIG. 8C
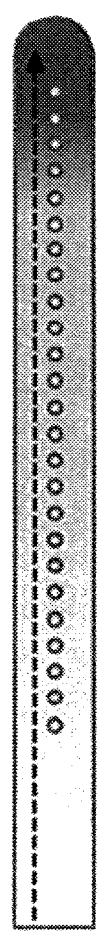
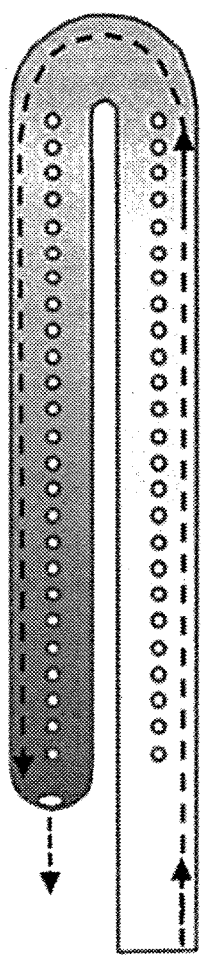
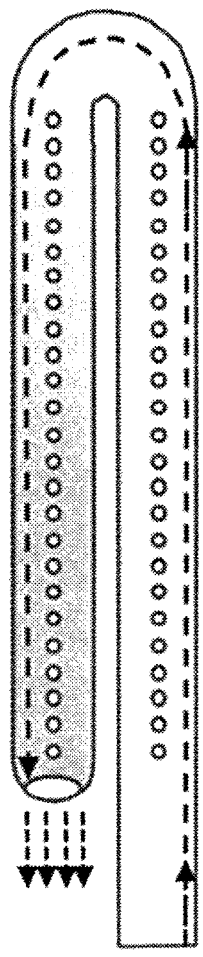
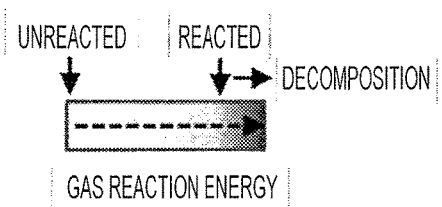

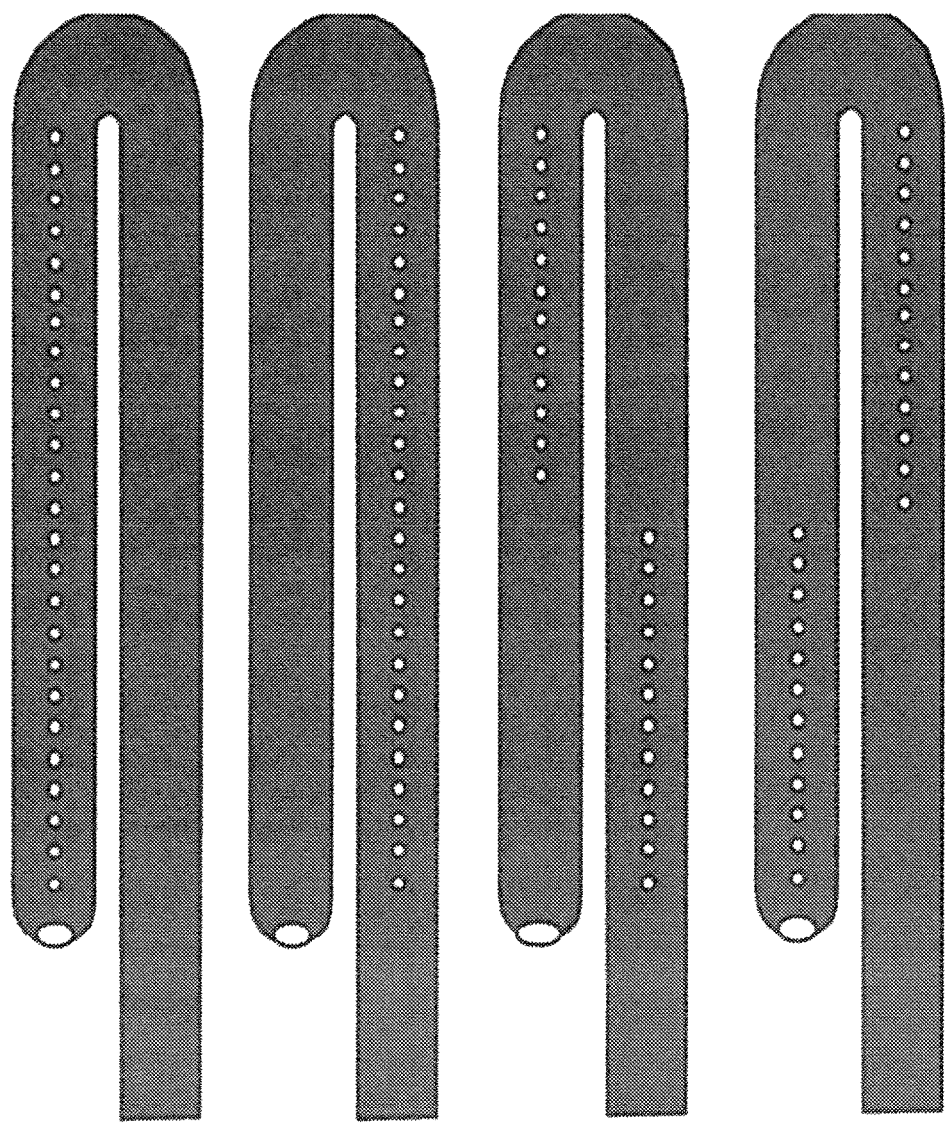

GAS SUPPLY NOZZLE, SUBSTRATE PROCESSING APPARATUS, AND NON-TRANSITORY COMPUTER-READABLE RECORDING MEDIUM

BACKGROUND OF THE INVENTION

Field of the Invention

The present invention relates to a gas supply nozzle, a substrate processing apparatus, a method of manufacturing a semiconductor device, and a program.

Description of the Related Art

As one process of a process of manufacturing a semiconductor device, in some cases, a process of forming films on substrates is performed by non-simultaneously supplying a source gas and a reaction gas to multiple stages of the substrates arranged in a processing chamber.

SUMMARY OF THE INVENTION

However, in recent years, since such a semiconductor device has a tendency to be highly integrated and the pattern size has been remarkably miniaturized, it has been difficult to uniformly form films on a substrate. The present invention is to provide a technique capable of improving film thickness uniformity among substrates.

According to an aspect of the present invention, there is provided a technology including: a nozzle base end portion which is provided in a processing chamber processing a substrate to extend in a vertical direction and into which a processing gas processing the substrate is introduced; a nozzle distal end portion which is configured in a U shape and in which a gas supply hole supplying the processing gas into the processing chamber is provided to a side surface of the substrate side; and a gas residence suppressing hole which is provided in a downstream end of the nozzle distal end portion and has a diameter larger than that of the gas supply hole.

According to the present invention, it is possible to improve film thickness uniformity among substrates.

BRIEF DESCRIPTION OF THE DRAWINGS

FIG. 8A is a diagram illustrating an image of a gas reaction ratio distribution in the straight nozzle shape, FIG. 8B is a diagram illustrating an image of the gas reaction ratio distribution in a case where the hole diameter of the gas residence suppressing hole in the nozzle distal end in the nozzle shape of FIG. 5 is set to $\phi 1.1$, and FIG. 8C is a diagram illustrating an image of the gas reaction ratio distribution in a case where the hole diameter of the gas residence suppressing hole in the nozzle distal end in the nozzle shape of FIG. 5 is set to $\phi 8$;

FIG. 10D is a diagram illustrating a case where the hole diameter of the gas residence suppressing hole in the nozzle distal end in the nozzle shape of FIG. 5 is set to $\phi 4$ and gas supply holes are provided to the nozzle at a downstream side from a folded portion of the nozzle, FIG. 10E is a diagram illustrating a case where the hole diameter of the gas residence suppressing hole in the nozzle distal end in the nozzle shape of FIG. 5 is set to $\phi 4$ and gas supply holes are provided to the nozzle at an upstream side from the folded portion of the nozzle, FIG. 10F is a diagram illustrating a case where the hole diameter of the gas residence suppressing hole in the nozzle distal end in the nozzle shape of FIG. 5 is set to $\phi 4$, gas supply holes are provided to the nozzle at the upstream side from the folded portion of the nozzle between a nozzle center and a nozzle base end portion, and gas supply holes are provided to the nozzle at the downstream side from the folded portion of the nozzle between the nozzle center and the folded portion of the nozzle, and FIG. 10G is a diagram illustrating a case where the hole diameter of the gas residence suppressing hole in the nozzle distal end in the nozzle shape of FIG. 5 is set to $\phi 4$, gas supply holes are provided to the nozzle at the upstream side from the folded portion between the nozzle center and the folded portion of the nozzle, and gas supply holes are provided to the nozzle at the downstream side from the folded portion of the nozzle between the nozzle center and the nozzle distal end portion;

DETAILED DESCRIPTION OF THE PREFERRED EMBODIMENTS

<First Embodiment>

Hereinafter, an embodiment of the present invention will be described with reference to FIGS. 1 to 3.

(1) Configuration of Substrate-Processing Apparatus (Heating Unit)

Figure 1:
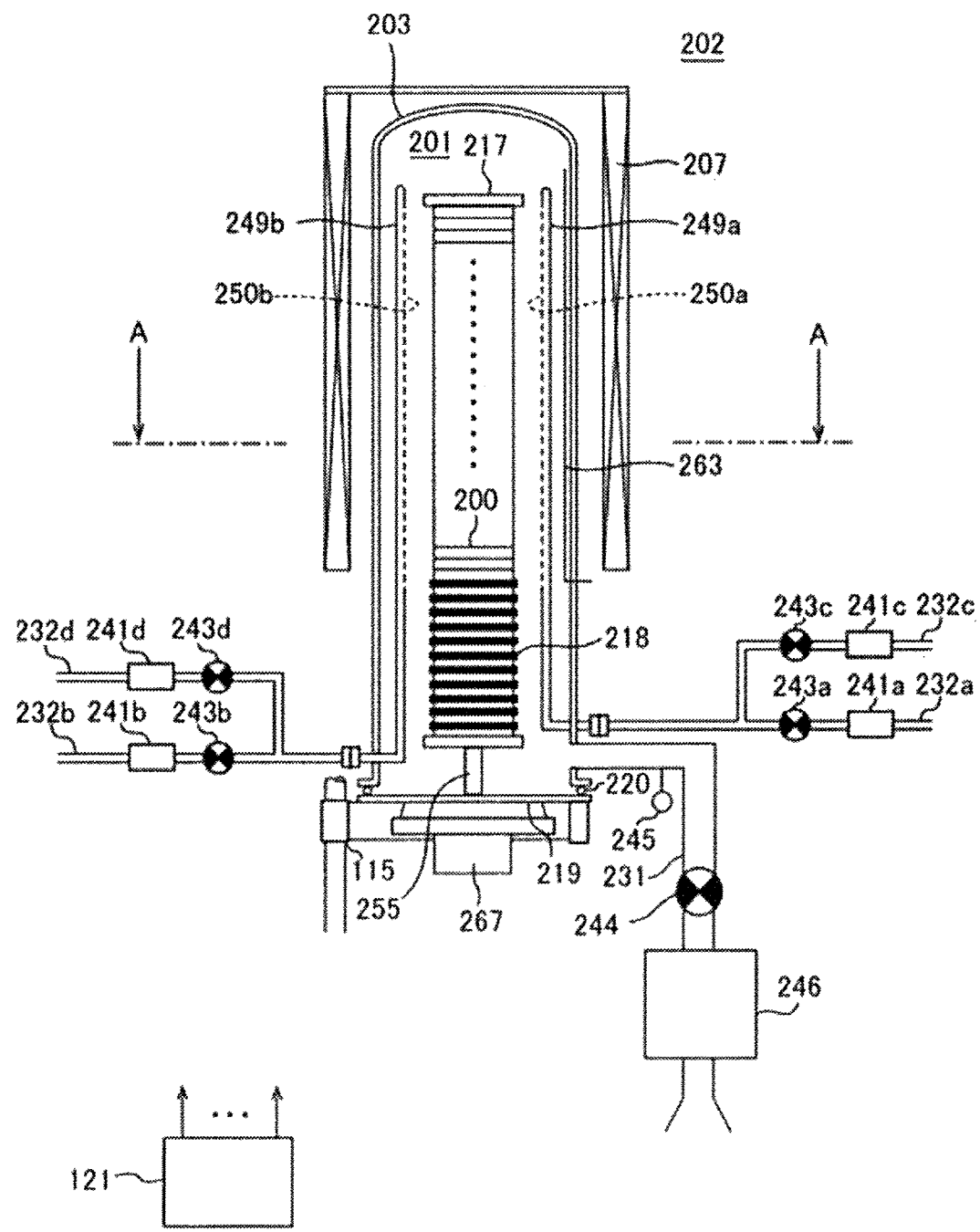
FIG. 1 is a schematic configuration diagram illustrating a vertical processing furnace in a substrate processing apparatus appropriately used for an embodiment of the present invention and is a vertical cross-sectional diagram illustrating a processing furnace portion.
Figure 2:
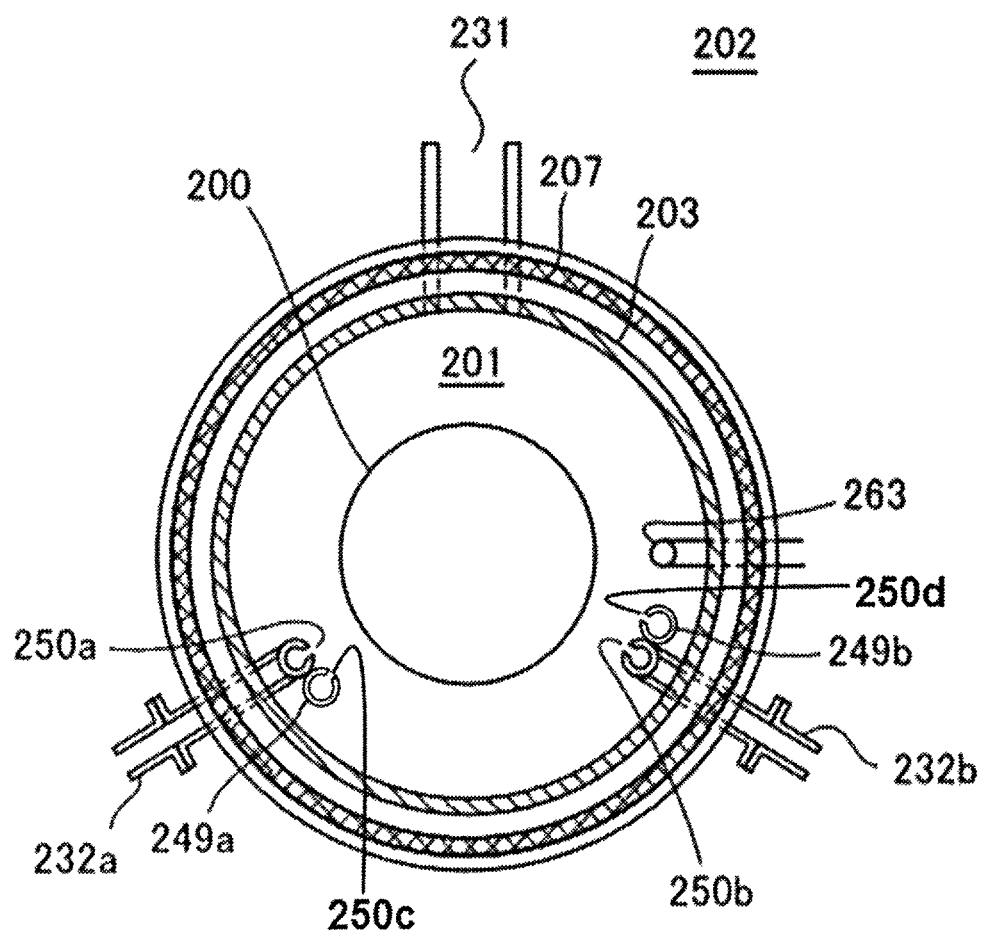
FIG. 2 is a schematic configuration diagram illustrating the vertical processing furnace in the substrate processing apparatus appropriately used for the embodiment of the present invention and is a cross-sectional diagram of the processing furnace portion taken along line A-A of FIG. 1.

As illustrated in FIG. 1, a processing furnace 202 includes a heater 207 as a heating unit (heating mechanism). The heater 207 has a cylindrical shape and is vertically installed by being supported by a heater base (not shown) as a holding plate. The heater 207 also functions as an activating mechanism (excitation unit) of activating (exciting) a gas by heat as described later.

A reaction tube 203 constituting a reaction container (process container) is installed inside the heater 207 to be concentric with the heater 207. The reaction tube 203 is made of a heat resistant material such as quartz ($SiO_2$) or silicon carbide (SiC) and is formed in a cylindrical shape of which top end is closed and of which bottom end is opened. A processing chamber 201 is formed in a cylindrical hollow portion of the reaction tube 203. The processing chamber 201 is configured so as to be capable of accommodating the wafers 200 as the substrates in the state that multiple stages of the wafers in a horizontal posture are arranged in the vertical direction by a later-described boat 217.

(Gas Supply Unit)

A nozzle 249a as the later-described first gas supply nozzle and a nozzle 249b as the later-described second gas supply nozzle are incorporated into the processing chamber 201 so as to penetrate the lower side wall of the reaction tube 203. Each of the nozzles 249a and 249b is configured with quartz. The nozzles 249a and 249b are connected to gas supply pipes 232a and 232b, respectively. In this manner, the two nozzles 249a and 249b and the two gas supply pipes 232a and 232b are provided to the reaction tube 203, so that plural types of gases can be supplied to the processing chamber 201.

However, the processing furnace 202 according to the embodiment is not limited to the above-described form. For example, a metal manifold supporting the reaction tube 203 is provided to the lower side of the reaction tube 203, and each nozzle may be provided so as to penetrate the side wall of the manifold. In this case, the later-described exhaust pipe 231 may be further provided to the manifold. Even in this case, the exhaust pipe 231 may be provided to not the manifold but the lower portion of the reaction tube 203. In this manner, the furnace opening portion of the processing furnace 202 is made of a metal, and the nozzles and the like may be attached to the metal furnace opening portion.

Mass flow controllers (MFCs) 241a and 241b that are flow rate controllers (flow rate control units) and valves 243a and 243b that are opening/closing valves are provided to the gas supply pipes 232a and 232b in the order from the upstream direction, respectively. Gas supply pipes 232c and 232d supplying inert gas are connected to downstream sides from the valves 243a and 243b of the gas supply pipes 232a and 232b, respectively. MFCs 241c and 241d that are flow rate controllers (flow rate control units) and valves 243c and 243d that are opening/closing valves are provided to the gas supply pipes 232c and 232d in the order from the upstream direction, respectively.

The nozzles 249a and 249b described later in detail are connected to distal end portions of the gas supply pipes 232a and 232b, respectively. In addition, the nozzles 249a and 249b may be collectively simply referred to as nozzles 249. As illustrated in FIG. 2, each of the nozzles 249a and 249b is provided in a ring-shaped space between the inner wall of the reaction tube 203 and the wafers 200 along an upper portion from a lower portion of the inner wall of the reaction tube 203 so as to stand erect upwards in the arrangement direction of the wafers 200. Namely, each of the nozzles 249a and 249b is provided at the side of a wafer arrangement region where the wafers 200 are arranged in a region horizontally surrounding the wafer arrangement region so as to extend along the wafer arrangement region. Namely, each of the nozzles 249a and 249b is provided on the side of the edge portion (circumference portion) of the wafer 200 carried into the processing chamber 201 to be perpendicular to the surface (flat surface) of the wafer 200. Each of the nozzles 249a and 249b is configured as an L-shaped long nozzle. Each horizontal portion thereof is provided so as to penetrate a lower side wall of the reaction tube 203, and each vertical portion thereof is provided so as to stand erect at least from the one end side to the other end side of the wafer arrangement region. Gas supply holes 250a and 250c and the gas supply holes 250b and 250d supplying gases are provided to the respective side surfaces of the nozzles 249a and 249b. In addition, the gas supply holes 250a and 250c provided to the nozzle 249a are simply referred to as the gas supply hole 250a (250c), and the gas supply holes 250b and 250d provided to the nozzle 249b are simply referred to as the gas supply hole 250b (250d). In addition, the gas supply holes 250a, 250b, 250c, and 250d are also collectively simply referred to as the gas supply hole 250. The gas supply holes 250a (250c) and the gas supply holes 250b (250d) are opened so as to be directed to the center of the reaction tube 203, so that the gas can be supplied toward the wafer 200. The plural gas supply holes 250a (250c) and the plural gas supply holes 250b (250d) are provided over the range from the lower portion to the upper portion of the reaction tube 203, have the same opening area, and are provided at the same opening pitch.

In this manner, in the embodiment, the gas is carried through the nozzles 249a and 249b arranged in a ring-shaped elongated space defined by an inner wall of the side wall of the reaction tube 203 and the edge portion (circumference portion) of the plural laminated wafers 200, that is, in a cylindrical space. The gas is ejected from the gas supply holes 250a (250c) and 250b (250d) opened in the respective nozzles 249a and 249b into the reaction tube 203 first in the vicinity of the wafers 200. The main flow of the gas in the reaction tube 203 is directed in the direction parallel to the surface of the wafer 200, that is, in the horizontal direction. By such a configuration, gas can be uniformly supplied to each wafer 200, so that it is possible to improve film thickness uniformity of a thin film formed on each wafer 200. The gas being flowed on the surface of the wafer 200, that is, the remaining gas after the reaction is flowed in the direction to the exhaust outlet, that is, the later-described exhaust pipe 231. However, the direction of the flow of the remaining gas is appropriately specified according to the position of the exhaust outlet, but the direction is not limited to the vertical direction.

As the source gas, for example, a halosilane source gas containing Si and halogen elements as predetermined elements is supplied from the gas supply pipe 232a through the MFC 241a, the valve 243a, and the nozzle 249a to the processing chamber 201.

The halosilane source gas is a gaseous halosilane source, for example, a gas obtained by vaporizing a halosilane source which is in a liquid state under the normal temperature and pressure, a halosilane source which is in a gas state under the normal temperature and pressure, or the like. The halosilane source is a silane source having a halogen group. The halogen group includes a chloro group, a fluoro group, a bromo group, an iodine group, and the like. Namely, the halogen group includes halogen elements such as chlorine (Cl), fluorine (F), bromine (Br), and iodine (I). It is can be said that the halosilane source is a kind of a halide. In this specification, the case of using the term "source" includes a case where the source denotes a "liquid source in a liquid state", a case where the source denotes a "source gas in a gas state", or a case where the source denotes both thereof.

As the halosilane source gas, for example, a C-free source gas containing Si and Cl, that is, an inorganic-based chlorosilane source gas may be used. As the inorganic-based chlorosilane source gas, for example, hexachlorodisilane ($Si_2Cl_6$, abbreviation: HCDS) gas, octachlorotrisilane ($Si_3Cl_8$, abbreviation: OCTS) gas, or the like may be used. It may be said that such a gas is a source gas having at least two Si in one molecule, further containing Cl, and having a Si—Si bond. Such a gas functions as a Si source in the later-described film-forming process.

In addition, as the halosilane source gas, for example, a source containing Si, Cl, and an alkylene group and having a Si—C bond that is, an alkylene chlorosilane source gas that is an organic-based chlorosilane source gas may be used. The alkylene group includes a methylene group, an ethylene group, a propylene group, a butylene group, and the like. The alkylene chlorosilane source gas may also be referred to as an alkylene halosilane source gas. As the alkylene chlorosilane source gas, for example, bis(trichlorosilyl) methane (($SiCl_3)_2CH_2$, abbreviation: BTCSM) gas, ethylene bis (trichlorosilane) gas, that is, 1,2-bis (trichlorosilyl) ethane (($SiCl_3)_2C_2H_4$, abbreviation: BTCSE) gas, or the like may be used. It may be said that such a gas is a source gas having at least two Si in one molecule, further containing C and Cl, and having a Si—C bond. Such a gas functions as a Si source and functions as a C source in the later-described film-forming process.

In addition, as the halosilane source gas, for example, a source gas containing Si, Cl, and an alkyl group and having a Si—C bond, that is, an alkyl chlorosilane source gas that is an organic-based chlorosilane source gas may be used. The alkyl group includes a methyl group, an ethyl group, a propyl group, a butyl group, and the like. The alkyl chlorosilane source gas may also be referred to as an alkyl halosilane source gas. As the alkyl chlorosilane source gas, for example, 1,1,2,2-tetrachloro-1,2-dimethyldisilane (($CH_3)_2Si_2Cl_4$, abbreviation: TCDMDS) gas, 1,2-dichloro-1,1,2,2-tetramethyl disilane (($CH_3)_4Si_2Cl_2$, abbreviation: DCTMDS) gas, 1-monochloro-1,1,2,2,2-pentamethyl disilane (($CH_3)_5Si_2Cl$, abbreviation: MCPMDS) gas may be used. It may be said that such a gas is a source gas having at least two Si in one molecule, further containing C and Cl, and having a Si—C bond. In addition, such a gas further has a Si—Si bond. Such a gas functions as a Si source and functions as a C source in the later-described film-forming process.

In the case of using a liquid source which is in a liquid state under the normal temperature and pressure such as HCDS, BTCSM, or TCDMDS, the liquid-state source is vaporized by a vaporizing system such as a vaporizer or a bubbler to be supplied as a source gas (HCDS gas, BTCSM gas, TCDMDS gas, or the like).

In addition, as a reaction gas having a chemical structure (molecular structure) different from that of the source gas, for example, a carbon (C)-containing gas is supplied from the gas supply pipe 232a through the MFC 241a, the valve 243a, and the nozzle 249a to the processing chamber 201. As the C-containing gas, for example, a hydrocarbon-based gas may be used. The hydrocarbon-based gas may be a material configured with only two elements of C and H and functions as a C source in the later-described film-forming process. As the hydrocarbon-based gas, for example, propylene ($C_3H_6$) gas may be used.

In addition, as a reaction gas having a chemical structure different from that of the source gas, for example, an oxygen (O)-containing gas is supplied from the gas supply pipe 232b through the MFC 241b, the valve 243b, and the nozzle 249b to the processing chamber 201. The O-containing gas functions as an oxidizing gas, that is, an O source in the later-described film-forming process. As the O-containing gas, for example, oxygen gas ($O_2$) may be used.

In addition, as the reaction gas having a chemical structure different from that of the source gas, for example, a hydrogen (H)-containing gas is supplied from the gas supply pipe 232b through the MFC 241b, the valve 243b, and the nozzle 249b to the processing chamber 201.

As the H-containing gas, for example, a hydrogen nitride-based gas that is a gas containing nitrogen (N) and hydrogen (H) may be used. The hydrogen nitride-based gas may be a material configured with only two elements of N and H and may also be referred to as a nitrogen (N)-containing gas. The N-containing gas functions as a nitriding gas, that is, an N source in the later-described film-forming process. As the hydrogen nitride-based gas, for example, ammonia ($NH_3$) gas may be used.

In addition, as the H-containing gas, for example, an amine-based gas that is a gas containing N, C, and H may be used. The amine-based gas may be a material configured with only three elements of C, N, and H and may also be referred to as a gas containing N and C. The amine-based gas functions as an N source and functions as a C source in the later-described film-forming process. As the amine-based gas, for example, triethylamine (($C_2H_5)_3N$, abbreviation: TEA) gas may be used. In the case of using amine which is in a liquid state under the normal temperature and pressure such as TEA, the liquid state amine is vaporized by a vaporizing system such as a vaporizer or a bubbler to be supplied as amine-based gas (TEA gas).

In addition, as the H-containing gas, for example, an organic hydrazine-based gas that is a gas containing N, C, and H may be used. The organic hydrazine-based gas may be a material configured with only three elements of N, C, and H and may be referred to as a gas containing N and C. The organic hydrazine-based gas functions as an N source and functions as a C source in the later-described film-forming process. As the organic hydrazine-based gas, for example, trimethyl hydrazine (($CH_3)_2N_2(CH_3)H$, abbreviation: TMH) gas may be used. In the case of using amine which is in a liquid state under the normal temperature and pressure such as TMH, the liquid state amine is vaporized by a vaporizing system such as a vaporizer or a bubbler to be supplied as organic hydrazine-based gas (TMH gas).

In addition, as the H-containing gas, for example, an N-free or C-free gas such as hydrogen ($H_2$) gas or deuterium ($D_2$) gas may be used.

As the inert gas, for example, the nitrogen ($N_2$) gas is supplied from the gas supply pipes 232c and 232d through the MFCs 241c and 241d, the valves 243c and 243d, the gas supply pipes 232a and 232b, and the nozzles 249a and 249b, respectively to the processing chamber 201.

In the case of supplying a source gas from the gas supply pipe 232a, the source gas supply system is configured to mainly include the gas supply pipe 232a, the MFC 241a, and the valve 243a. The nozzle 249a may be considered to be included in the source gas supply system. The source gas supply system may also be referred to as a source supply system. In the case of supplying a halosilane source gas from the gas supply pipe 232a, the source gas supply system may also be referred to as a halosilane source gas supply system or a halosilane source supply system.

In the case of supplying the C-containing gas from the gas supply pipe 232a, the C-containing gas supply system is configured to mainly include the gas supply pipe 232a, the MFC 241a, and the valve 243a. The nozzle 249a may be considered to be included in the C-containing gas supply system. In the case of supplying the hydrocarbon-based gas from the gas supply pipe 232a, the C-containing gas supply system may also be referred to as a hydrocarbon-based gas supply system or a hydrocarbon supply system.

In the case of supplying the O-containing gas from the gas supply pipe 232b, the O-containing gas supply system is configured to mainly include the gas supply pipe 232b, the MFC 241b, and the valve 243b. The nozzle 249b may be considered to be included in the O-containing gas supply system. The O-containing gas supply system may also be referred to as an oxidizing gas supply system or an oxidant supply system.

In the case of supplying an H-containing gas from the gas supply pipe 232b, the H-containing gas supply system is configured to mainly include the gas supply pipe 232b, the MFC 241b, and the valve 243b. The nozzle 249b may be considered to be included in the H-containing gas supply system. In the case of supplying a gas containing N and H from the gas supply pipe 232b, the H-containing gas supply system may also be referred to as an N-containing gas supply system, an N- and H-containing gas supply system, or the like. In addition, in the case of supplying a gas containing N, C, and H from the gas supply pipe 232b, the H-containing gas supply system may also be referred to as an N-containing gas supply system, a C-containing gas supply system, an N- and C-containing gas supply system, or the like. The N-containing gas supply system may also be referred to as a nitriding gas supply system or a nitriding agent supply system. In the case of supplying a hydrogen nitride-based gas, an amine-based gas, or an organic hydrazine-based gas as the H-containing gas, the H-containing gas supply system may also be referred to as a hydrogen nitride-based gas supply system, an amine-based gas supply system, or an organic hydrazine-based gas supply system.

Anyone of the C-containing gas supply system, the O-containing gas supply system, and the H-containing gas supply system described above or all the gas supply systems may also be referred to as a reaction gas supply system or a reactant supply system.

In addition, the inert gas supply system is configured to mainly include the gas supply pipes 232c and 232d, the MFCs 241c and 241d, and the valves 243c and 243d. The inert gas supply system may also be referred to as a purging gas supply system, a diluted gas supply system, or a carrier gas supply system.

In addition, all the gases of the source gas, the reaction gas, the inert gas, and the like which are supplied to the processing chamber 201 through the nozzles 249a and 249b may be collectively referred to as a processing gas.

(Exhaustion Unit)

The exhaust pipe 231 exhausting the atmosphere in the processing chamber 201 is provided to the reaction tube 203. A vacuum pump 246 as a vacuum evacuation apparatus is connected to the exhaust pipe 231 through a pressure sensor 245 as a pressure detector (pressure detection unit) detecting the pressure of the processing chamber 201 and an APC (auto pressure controller) valve 244 as a pressure regulator (pressure regulation unit). The APC valve 244 is a valve configured to be capable of performing vacuum evacuation and vacuum evacuation stop of the processing chamber 201 by opening and closing the valve in the state that the vacuum pump 246 is operated and is also a valve configured to be capable of regulating the pressure of the processing chamber 201 by regulating a valve opening degree based on pressure information detected by the pressure sensor 245 in the state that the vacuum pump 246 is operated. An exhaust system is configured to mainly include the exhaust pipe 231, the APC valve 244, and the pressure sensor 245. The vacuum pump 246 may be considered to be included in the exhaust system.

(Peripheral Mechanisms)

A seal cap 219 as a furnace opening lid body capable of air-tightly closing a bottom end opening of the reaction tube 203 is installed below the reaction tube 203. The seal cap 219 is configured so as to be in contact with the bottom end of the reaction tube 203 from the bottom side in the vertical direction. The seal cap 219 is made of, for example, a metal such as SUS and is formed in a disk shape. An O-ring 220 as a sealing member being in contact with the bottom end of the reaction tube 203 is provided on the top surface of the seal cap 219. A rotation mechanism 267 rotating the later-described boat 217 is provided to the side of the seal cap 219 opposite to the processing chamber 201. A rotation shaft 255 of the rotation mechanism 267 penetrates the seal cap 219 to be connected to the boat 217. The rotation mechanism 267 is configured to rotate the wafer 200 by rotating the boat 217. The seal cap 219 is configured to be lifted up and down in the vertical direction by a boat elevator 115 as a lifting mechanism provided vertically outside the reaction tube 203. The boat elevator 115 is configured to be capable of loading and unloading the boat 217 into and from the processing chamber 201 by lifting up and down the seal cap 219. Namely, the boat elevator 115 is configured as a carrying unit (carrying mechanism) carrying the boat 217, that is, the wafer 200 into and from the processing chamber 201.

(Substrate Supporting Jig)

The boat 217 as a substrate supporting jig is configured so as to support multiple stages of plural wafers, for example, 25 to 200 of the wafers 200 to be in a horizontal posture and to be arranged in the vertical direction in the state that the centers of the wafers are aligned with one another, namely, to arrange the wafers to be spaced with an interval. The boat 217 is made of a heat resistant material such as quartz or SiC. The lower portion of the boat 217 is supported by multiple stages of insulating plates 218 which are made of a heat resistant material such as quartz or SiC in a horizontal posture. By this configuration, heat from the heater 207 is not easily transmitted to the seal cap 219 side. However, the embodiment is not limited to the above-described form. For example, the insulating plates 218 are not provided in the lower portion of the boat 217, but an insulating cylinder configured with a cylindrical member made of a heat resistant material such as quartz or SiC may be provided.

(Temperature Sensor)

A temperature sensor 263 as a temperature detector is provided inside the reaction tube 203. By adjusting an electric conduction state of the heater 207 based on temperature information detected by the temperature sensor 263, the temperature of the processing chamber 201 is in a desired temperature distribution. The temperature sensor 263 is configured in an L shape similarly to the nozzles 249a and 249b and is provided along the inner wall of the reaction tube 203.

(Control Unit)

Figure 3:
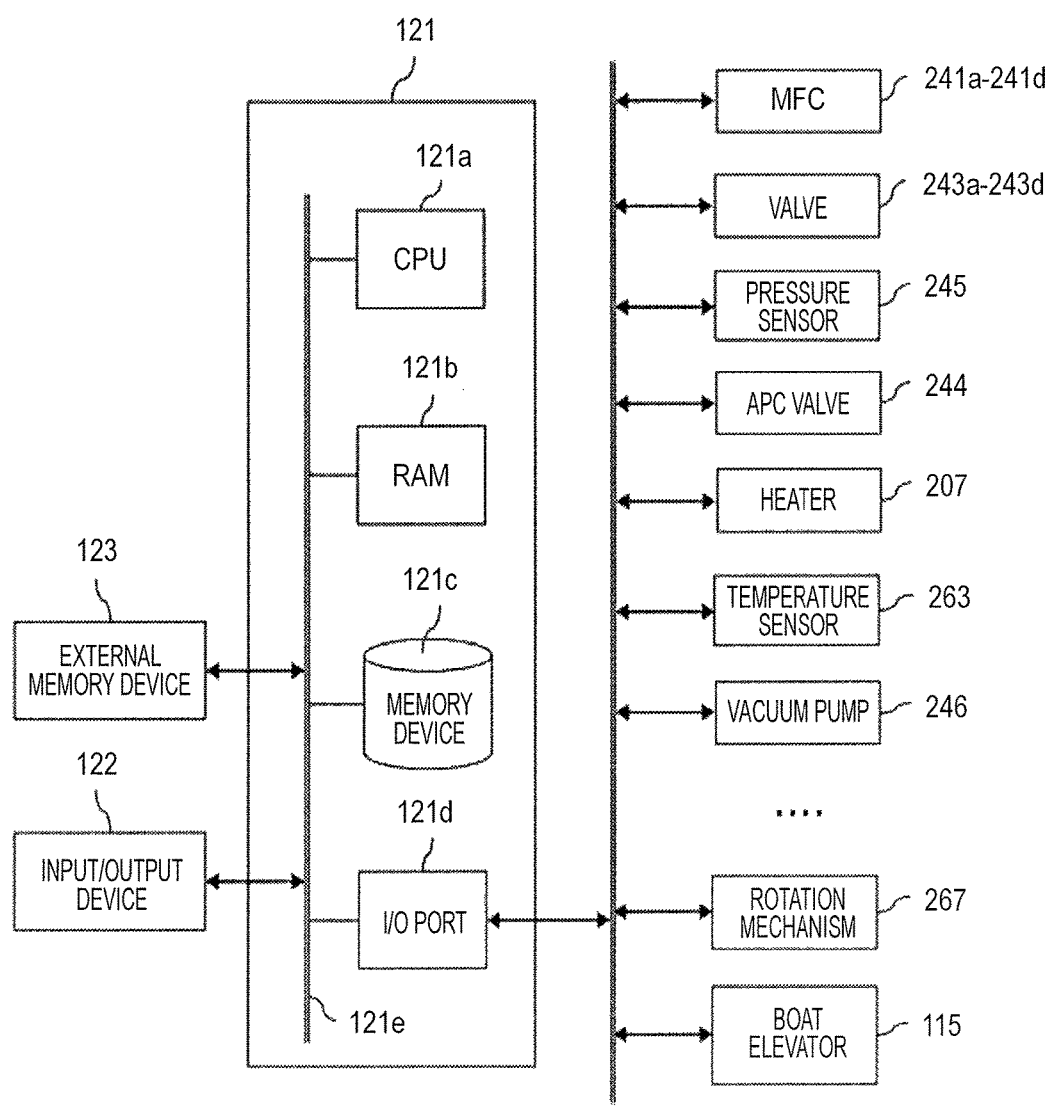
FIG. 3 is a schematic configuration diagram illustrating a controller in the substrate processing apparatus appropriately used for the embodiment of the present invention and is a block diagram illustrating a control system of the controller.

As illustrated in FIG. 3, a controller 121 that is a control unit is configured as a computer including a CPU (Central Processing Unit) 121a, a RAM (Random Access Memory) 121b, a memory device 121c, and an I/O port 121d. The RAM 121b, the memory device 121c, and the I/O port 121d are configured to be capable of exchanging data with the CPU 121a via an internal bus 121e. An input/output device 122 such as a touch panel is connected to the controller 121.

The memory device 121c is configured with, for example, a flash memory, an HDD (hard disk drive), or the like. A control program controlling operations of the substrate processing apparatus, an etching recipe, a process recipe, and the like describing procedures, conditions, and the like of an etching process and a film-forming process of the nozzle described later, and the like are readably stored in the memory device 121c. The etching recipe or the process recipe is a combination of procedures in the later-described substrate processing process so as to obtain a predetermined result by allowing the controller 121 to execute the procedures and functions as a program. Hereinafter, the process recipe, the control program, and the like are also collectively simply referred to as a program. In addition, the etching recipe or the process recipe is also simply referred to as a recipe. In this specification, as the case of using the term "program", there is a case including only the recipe alone, a case including only the control program along, or a case including both thereof. The RAM 121b is configured as a memory area (work area) temporarily retaining a program, data, and the like read out by the CPU 121a.

The I/O port 121d is connected to the MFCs 241a to 241d, the valves 243a to 243d, the pressure sensor 245, the APC valve 244, vacuum pump 246, the heater 207, the temperature sensor 263, the rotation mechanism 267, the boat elevator 115, and the like described above.

The CPU 121a is configured to execute reading the control program from the memory device 121c and to read out the recipe from the memory device 121c according to input or the like of a manipulation command from the input/output device 122. The CPU 121a is configured to control, according to contents of the read recipe, flow rate regulating operations for various gases by the MFCs 241a to 241d, a pressure regulating operation by the APC valve 244 based on opening/closing operations of the valves 243a to 243d, opening/closing operations of the APC valve 244, and the pressure sensor 245, activating and stopping of the vacuum pump 246, an adjusting operation of the temperature of the heater 207 based on the temperature sensor 263, an adjusting operation of the rotation and rotation speed of the boat 217 by the rotation mechanism 267, lifting up/down operations of the boat 217 by the boat elevator 115, and the like.

The controller 121 may be configured to install the above-described program stored in an external memory device (for example, a magnetic tape, a magnetic disk such as a flexible disk or a hard disk, an optical disk such as a CD or a DVD, a magneto-optical disk such as an MO, or a semiconductor memory such as a USB memory or a memory card) 123 in the computer. The memory device 121c and the external memory device 123 are configured as a non-transitory computer-readable recording medium. Hereinafter, these are also collectively simply referred to as a recording medium. In this specification, as the case of using the term "recording medium", there is a case including only the memory device 121c alone, a case including only the external memory device 123, or a case including both thereof. In addition, supplying the program to the computer may be performed by using a communication unit such as the Internet or a private line without using the external memory device 123.

(Gas Supply Nozzle)

Figure 4:
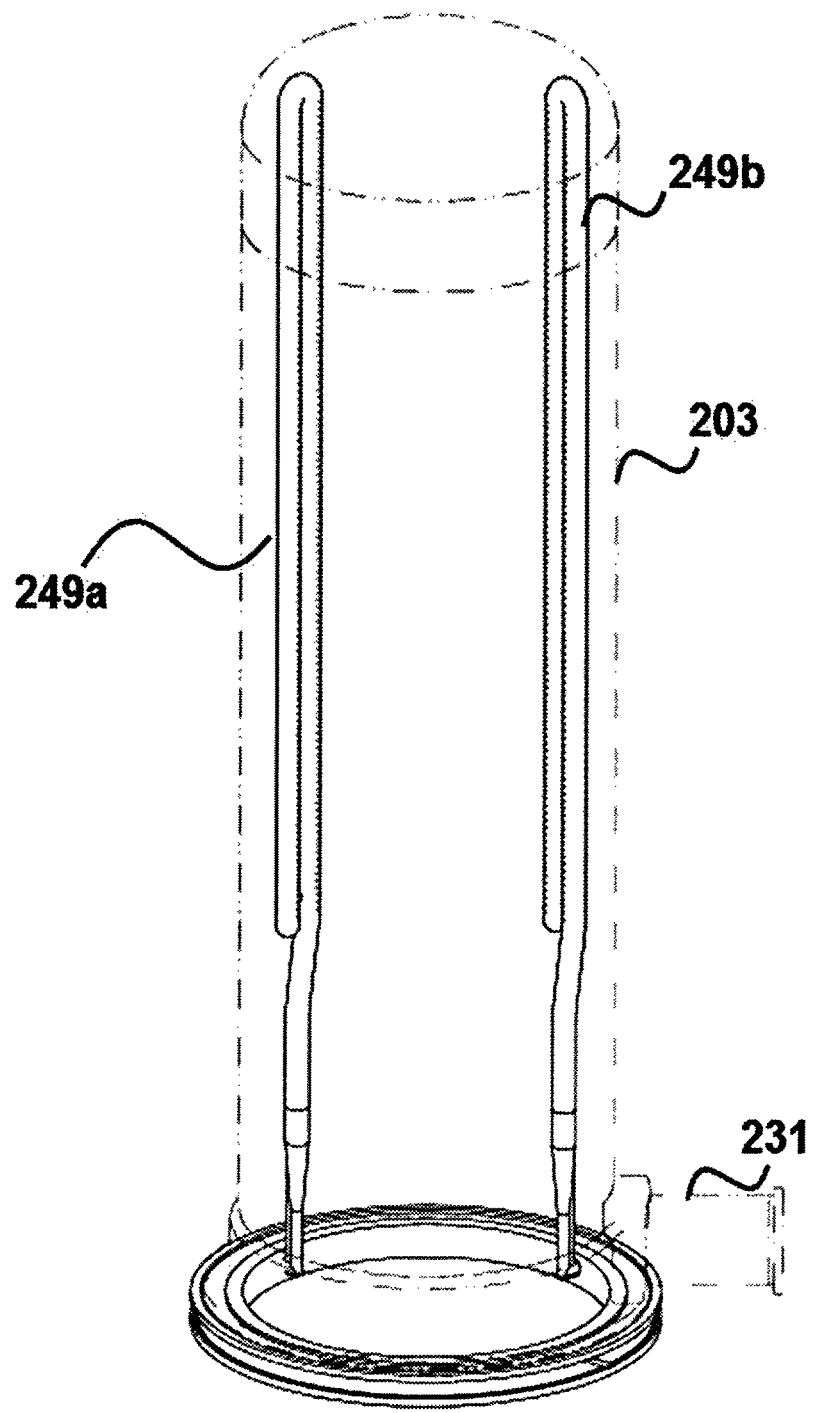
FIG. 4 is a diagram illustrating an installation example of a process container and nozzles in the substrate processing apparatus appropriately used for the embodiment of the present invention.
Figure 5:
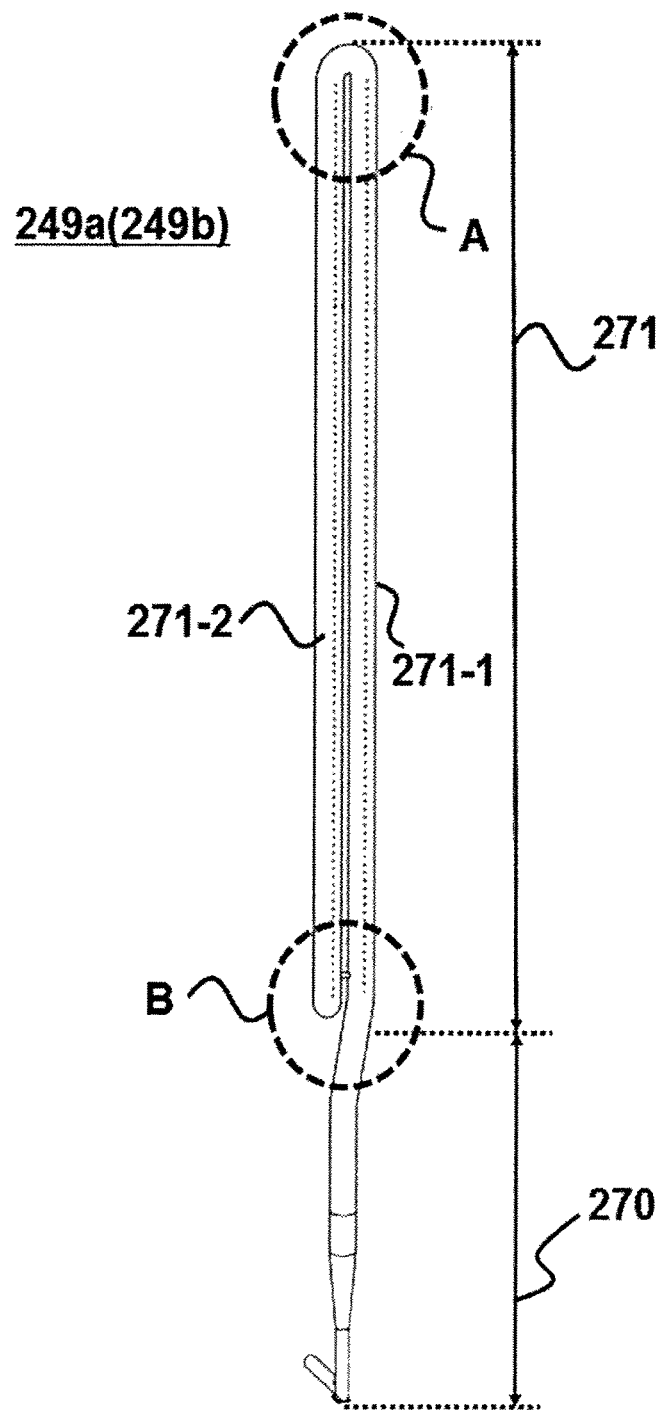
FIG. 5 is a perspective diagram illustrating the nozzle in the substrate processing apparatus appropriately used for the embodiment of the present invention.
Figure 6A:
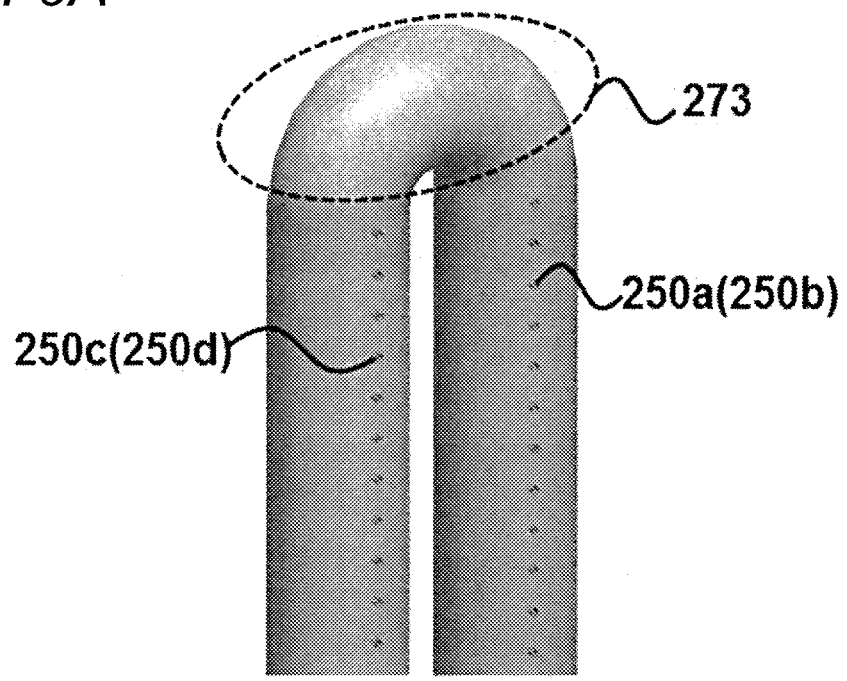
FIG. 6A is an enlarged diagram illustrating a broken-line region A of the nozzle of FIG. 5.
Figure 6B:
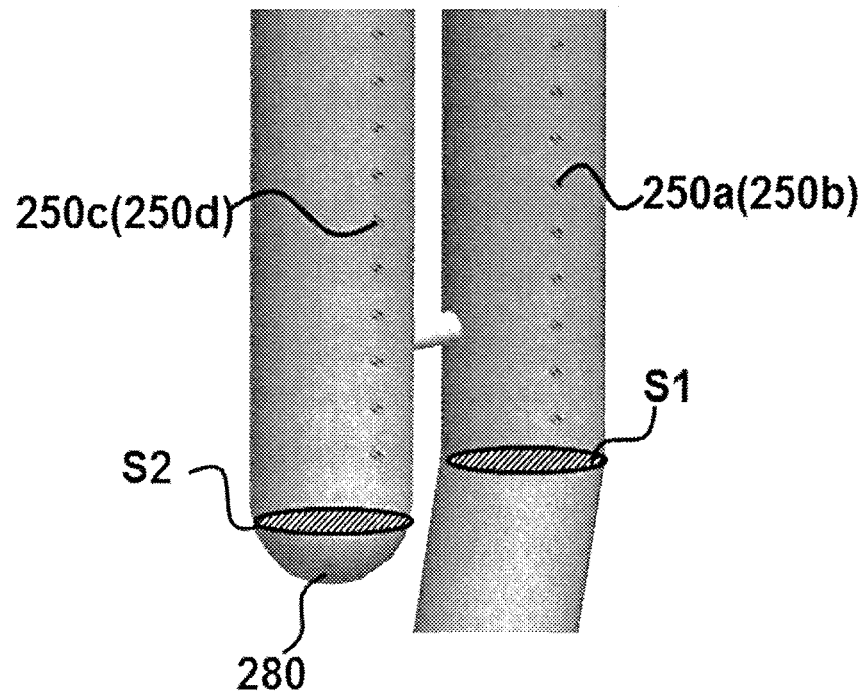
FIG. 6B is an enlarged diagram illustrating a broken-line region B of the nozzle of FIG. 5.

Next, the nozzle 249 for supplying the processing gas will be described with reference to FIGS. 4 to 8C. As illustrated in FIG. 4, the nozzles 249a and 249b supplying the gas are extended in the vertical direction inside the reaction tube 203. As illustrated in FIG. 5, the nozzle 249 is configured with an L-shaped nozzle base end portion 270 and a U-shaped nozzle distal end portion 271. In addition, as illustrated in FIGS. 5, 6A, and 6B, the nozzle distal end portion 271 is configured with a folded portion 273, an upstream side pipe 271-1 connecting the nozzle base end portion 270 and the folded portion 273, and a downstream side pipe 271-2 connected to a downstream end of the folded portion 273. The gas supply holes 250 supplying the processing gas to the processing chamber 201 are provided to side surfaces of the upstream side pipe 271-1 and the downstream side pipe 271-2 in the directions different from the folding direction of the folded portion 273. A gas residence suppressing hole 280 for suppressing residence of the processing gas in the nozzle is provided to the downstream end of the downstream side pipe 271-2. Herein, the folded portion 273 indicates the gas supply nozzle 249 existing at the side in the vertical direction upper than the gas supply hole 250 located at the highest position of the gas supply nozzle and indicates the portion of changing the direction of the gas flow. In addition, in this specification, as the case of using the term "folded portion 273", there is one of a case denoting the "nozzle 249 existing at the side in the vertical direction upper than the gas supply hole 250 located at the highest position" and a case denoting the "portion of changing the direction of the gas flow in the nozzle distal end portion 271" or a case denoting both thereof.

As illustrated in FIG. 6B, the gas residence suppressing hole 280 is formed to have a hole diameter larger than that of the gas supply hole 250 in order to suppress the residence of the processing gas supplied to the nozzle 249 inside the nozzle and is formed to have a hole diameter smaller than a pipe diameter of the downstream side pipe 271-2. By such a configuration, it is possible to suppress the residence of the supplied processing gas in the downstream end of the downstream side pipe 271-2. In addition, the processing gas is prevented from being in an exhaust rate-controlling of the gas residence suppressing hole 280, so that it is possible to efficiently supply the uniformly activated processing gas from the gas supply hole 250 to the wafer 200.

If the hole diameter of the gas residence suppressing hole 280 is smaller than that of the gas supply hole 250, the gas supplied to the nozzle 249 is hard to pull out, so that the gas resides in the downstream end of the downstream side pipe 271-2. For this reason, a large amount of the processing gas which is heated by the heating unit to be activated is easily supplied mainly from the vicinity of the downstream end of the downstream side pipe 271-2, and thus, the film thickness uniformity between the surfaces of the multiple stages of the wafers 200 arranged in the horizontal direction cannot be achieved. In addition, a deposited film is formed on an inner wall in the vicinity of the downstream end of the downstream side pipe 271-2 by the activated processing gas, and in some cases, there is possibility that the gas supply holes 250 is obstructed. On the contrary, if the hole diameter of the gas residence suppressing hole 280 is formed to be a certain diameter, for example, a hole diameter equal to the pipe diameter of the downstream side pipe 271-2, the supplied processing gas is in an exhaust rate-controlling of the gas residence suppressing hole 280, so that it is difficult to supply the gas from the gas supply hole 250.

Therefore, the gas residence suppressing hole 280 needs to be configured to have a hole diameter larger than the hole diameter of the gas supply hole 250. Appropriately, the gas residence suppressing hole 280 is preferably configured to have a hole diameter in a range of 1.1 times to 25 times the hole diameter of the gas supply hole 250. More appropriately, the gas residence suppressing hole 280 is preferably configured to have a hole diameter in a range of 5 times to 15 times the hole diameter of the gas supply hole 250. In addition, further more appropriately, it is preferable that the hole diameter of the gas residence suppressing hole 280 is configured so that the flow velocity of the gas being flowed on a horizontal cross section S1 of the upstream side pipe 271-1 located below the gas supply hole 250a (250b) located at the lowest position of the upstream side pipe 271-1 is equal to the flow velocity of the gas being flowed on a horizontal cross section S2 of the downstream side pipe 271-2 located below the gas supply hole 250c (250d) located at the lowest position of the downstream side pipe 271-2.

In addition, the gas residence suppressing hole 280 is provided at the distal end of the nozzle 249 downward, and for example, as illustrated in FIG. 1 or FIG. 4, the gas residence suppressing hole 280 is located in the vicinity of an exhaust outlet. By such a configuration, it is possible to prevent the gas from being excessively supplied to the wafer 200, and the by-products such as particles inside the nozzle 249 can be easily exhausted without being attached on the wafer 200.

Figure 7A:
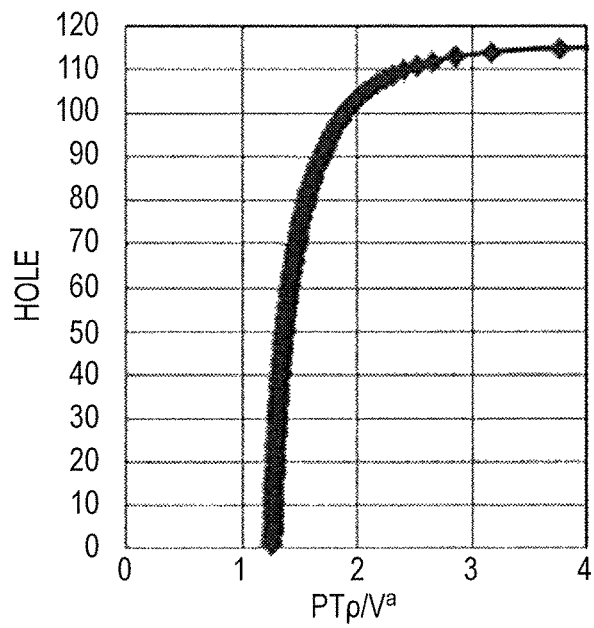
FIG. 7A is a diagram illustrating a relationship between a height direction of the nozzle and a gas reaction ratio in a straight nozzle shape.

Next, in the case of supplying a gas by using a straight-tube-type nozzle (for example, a nozzle 251 illustrated in FIG. 11 described later), the gas reaction ratio (decomposition ratio) in the nozzle will be described with respect to FIG. 7A, and in the case of supplying a gas by using the nozzle 249 illustrated in FIG. 5, the gas reaction ratio (decomposition ratio) in the nozzle 249 will be described with reference to FIGS. 7B, 7C and 7D and FIGS. 8A to 8C. The evaluation conditions in FIGS. 7A to 7D are as follows. The substrate processing temperature is heated to 600° C., 0.3 slm of the HCDS gas and 0.5 slm of $N_2$ gas are supplied as the processing gas, the substrate processing pressure is set to 50 Pa, the hole diameter of the gas supply hole and the number of the gas supply holes are set to $\phi 1$ mm×143, and the interval (pitch) of the gas supply holes is set to about 8 mm. In addition, as illustrated in FIGS. 7A to 7D, the gas supply holes are denoted by serial numbers over the range from the lower portion to the upper portion of the nozzle 249 in the vertical direction, heights corresponding to the serial numbers of the gas supply holes are indicated on the vertical axis, the reaction ratios ($PT\rho/V^a$) in the nozzle 249 obtained by calculation using pressure, temperature, density, and gas flow velocity in the nozzle are indicated on the horizontal axis. Namely, the vertical axis indicates the height of the nozzle 249 in the vertical direction, and the horizontal axis indicates the amount of the gas reacted (decomposed) in the nozzle 249. It can be determined that, as the graph is close to a straight line, the inter-plane film thickness uniformity between the wafers 200 is good.

As illustrated in FIG. 7A, it can be understood that, as it goes to the upper portion of the graph, the processing gas in the nozzle is reacted (decomposed). Namely, the processing gas is reacted at the position which is farthest away from the nozzle upstream portion where the processing gas is introduced, and if this is compared with a predetermined film formed on the wafer 200, it can be determined that the film thickness of the wafer 200 in the upper portion in the vertical direction is increased, and thus, the inter-plane film thickness uniformity cannot be achieved. If the magnitude of the decomposed amount is indicated by color density by using a schematic diagram of the nozzle shape, as illustrated in FIG. 8A, this is illustrated so that, as it goes to the upper portion of the nozzle, the color becomes darker. It is considered that this is because the heating time and length of the processing gas in the upper portion of the nozzle are larger than those of the processing gas in the lower portion of the nozzle. In other words, it is considered that this is because, as it goes to the distal end portion in the upper portion of the nozzle, the flow velocity of the supplied processing gas becomes slow so as to be close to 0 m/s, and as the flow velocity is slow, the processing gas is easily heated and reacted.

Figure 7B:
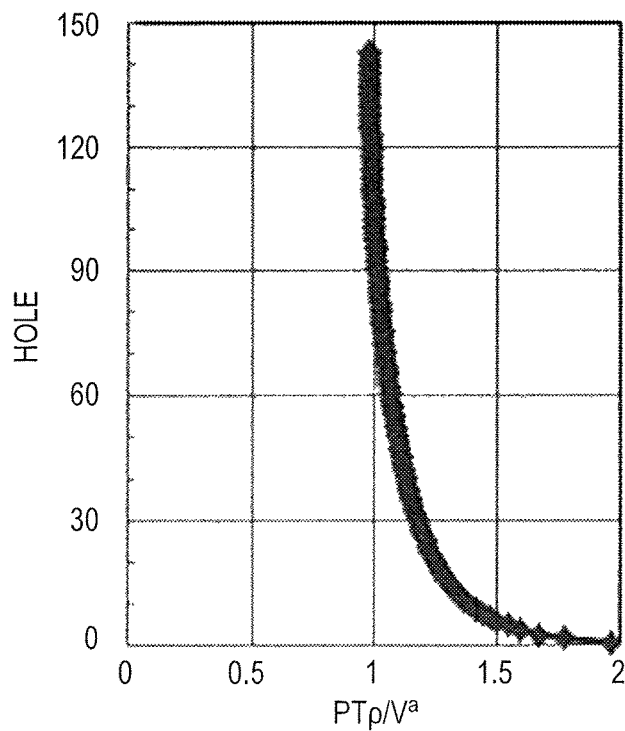
FIG. 7B is a diagram illustrating a relationship between the height direction of the nozzle and the gas reaction ratio in a case where a hole diameter of a gas residence suppressing hole in a nozzle distal end in the nozzle shape of FIG. 5 is $\phi 1.1$.

In contrast, as illustrated in FIG. 7B, on the contrary to FIG. 7A, it can be understood that, as it goes to the lower portion of the graph, the processing gas is reacted inside the nozzle 249. This is the same as FIG. 7A in that the processing gas is reacted at the position which is farthest away from the nozzle base end portion 270 where the processing gas is introduced. However, this is because the nozzle distal end portion 271 of the nozzle 249 has a U shape and the distal end of the nozzle 249 is located at the lower portion in the vertical direction, that is, the position which is farthest away from the nozzle upstream portion where the processing gas is introduced. Therefore, as it goes to the lower portion in the vertical direction, the film thickness of a predetermined film formed on the wafer 200 is increased, so that the inter-plane film thickness uniformity between the wafers 200 cannot be easily achieved. However, as illustrated in FIG. 7B, the gas residence suppressing hole 280 having a hole diameter of φ1.1 mm is provided at the distal end of the nozzle 249, and the processing gas is exhausted from the gas residence suppressing hole 280. Therefore, it can be determined that, in comparison with FIG. 7A, the flow velocity of the processing gas in the nozzle distal end portion is fast and the inter-plane film thickness uniformity of the film thickness between the wafers 200 is improved.

Figure 7C:
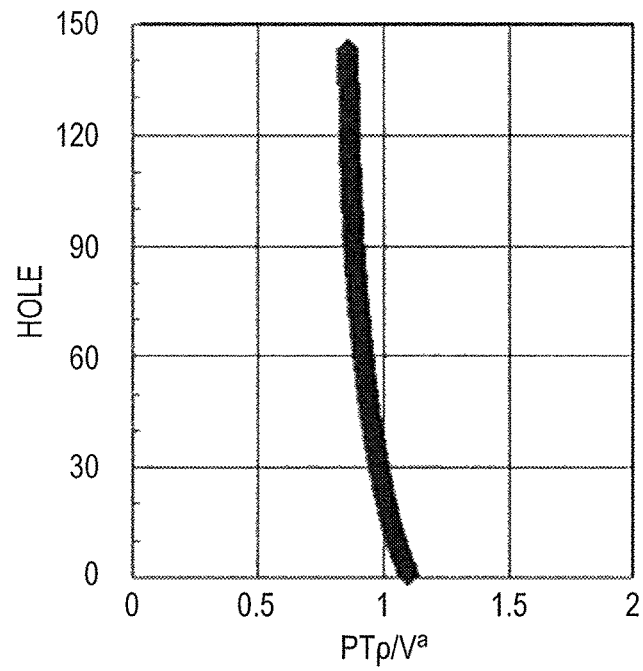
FIG. 7C is a diagram illustrating a relationship between the height direction of the nozzle and the gas reaction ratio in a case where the hole diameter of the gas residence suppressing hole in the nozzle distal end in the nozzle shape of FIG. 5 is $\phi 4$.

In addition, it can be understood that, as illustrated in FIG. 7C, similarly to FIG. 7B, as it goes to the lower portion of the graph, the gas is reacted inside the nozzle 249. This is because, as illustrated in FIG. 7B, the nozzle distal end portion 271 of the nozzle 249 has a U shape, and the distal end of the nozzle 249 at the position which is farthest away from the nozzle upstream portion where the processing gas is introduced is located in the lower portion in the vertical direction, so that the activated gas is easily supplied to the lower portion. If the magnitude of the decomposed amount is indicated by color density by using a schematic diagram of the nozzle shape, as illustrated in FIG. 8B, this is illustrated so that, in the upstream side pipe 271-1, the color density is almost uniform, but in the downstream side pipe 271-2, as it goes to the lower portion of the nozzle, the color becomes darker. Herein, as illustrated in FIG. 7C, it can be understood that a deviation between the reaction ratio in the lower portion of the nozzle and the reaction ratio in the upper portion of the nozzle is suppressed in comparison with FIG. 7B. This is because the hole diameter of the gas residence suppressing hole 280 is φ4 mm and larger than that illustrated in FIG. 7B, and thus, the flow velocity of the processing gas in the distal end portion of the nozzle 249 is further heightened. Therefore, the residence of the processing gas in the distal end portion of the nozzle 249 is suppressed, and thus, it can be determined that the inter-plane film thickness uniformity between the wafers 200 is remarkably improved.

Figure 7D:
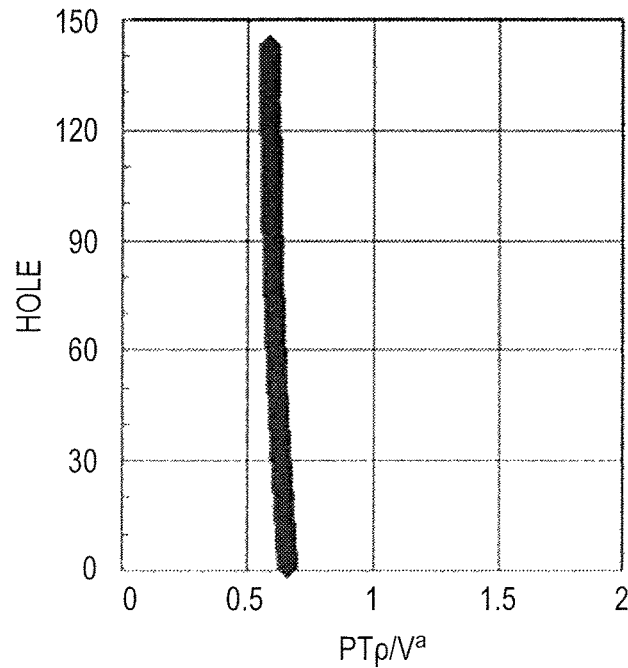
FIG. 7D is a diagram illustrating a relationship between the height direction of the nozzle and the gas reaction ratio in a case where the hole diameter of the gas residence suppressing hole in the nozzle distal end in the nozzle shape of FIG. 5 is $\phi 8$.

As illustrated in FIG. 7D, it can be understood that the slope of the graph in the vertical direction is almost zero, and the reaction ration inside the nozzle is almost uniform in the upper and lower portions. Namely, it can be understood that the inter-plane film thickness uniformity between the wafers 200 can be achieved. It is considered that this is because, as illustrated in FIG. 8C, the hole diameter of the gas residence suppressing hole 280 is formed to be φ8 mm, and thus, the flow velocity of the processing gas in the distal end portion of the nozzle 249 is higher than that of the case illustrated in FIG. 7C, so that the flow velocity is close to the flow velocity of the processing gas introduced into the nozzle distal end portion 271. By configuring the gas residence suppressing hole 280 in this manner, it can be determined that, without the processing gas supplied to the gas supply nozzle 249 being in an exhaust rate-controlling by the gas residence suppressing hole 280, and the residence of the processing gas in the distal end portion of the nozzle 249 is suppressed, and the uniformly heated processing gas is supplied from the gas supply holes to the processing chamber 201.

Heretofore, it is preferable that the hole diameter of the gas residence suppressing hole 280 is configured so as to be in a range of 1/90 times or more and less than 1 times the nozzle diameter of the nozzle 249. It is more preferable that the hole diameter of the gas residence suppressing hole 280 is configured so as to be in a range of 0.3 times or more and 0.7 times or less the nozzle diameter of the nozzle 249.

In addition, it is preferable that the hole diameter of the gas residence suppressing hole 280 is configured so as to be in a range of 0.05 times or more and less than 1 times the distal end area of the nozzle 249. It is more preferable that the hole diameter of the gas residence suppressing hole 280 is configured so as to be in a range of 0.1 times or more and 0.5 times or less the distal end area of the nozzle 249.

In addition, the gas residence suppressing hole 280 may be provided to any location on the distal end surface of the nozzle 249 as well as the center of the distal end portion of the nozzle 249, and plural gas residence suppressing holes may be provided. By such a configuration, it is possible to more efficiently suppress the residence of the gas in the distal end of the nozzle 249.

(2) Film-Forming Process

As one process of the method of manufacturing the semiconductor device (device) by using the above-described substrate processing apparatus, an example of sequences of a process (hereinafter, referred to as a film-forming process) of forming a film on the substrate will be described with reference to FIG. 9. In the description hereinafter, operations of each component constituting the substrate processing apparatus are controlled by the controller 121.

In the film-forming process according to the embodiment, a film is formed on the wafer 200 by performing a predetermined number of times (once or more) of a cycle of non-simultaneously performing:

a step of supplying a source gas to the wafer 200 as a substrate in the processing chamber 201 through the nozzle 249a as a first nozzle;

a step of supplying an O-containing gas to the wafer 200 in the processing chamber 201 through the nozzle 249b as a second nozzle which is configured with quartz and is different from the nozzle 249a; and a step of supplying an H-containing gas to the wafer 200 in the processing chamber 201 through the nozzle 249b.

Figure 9:
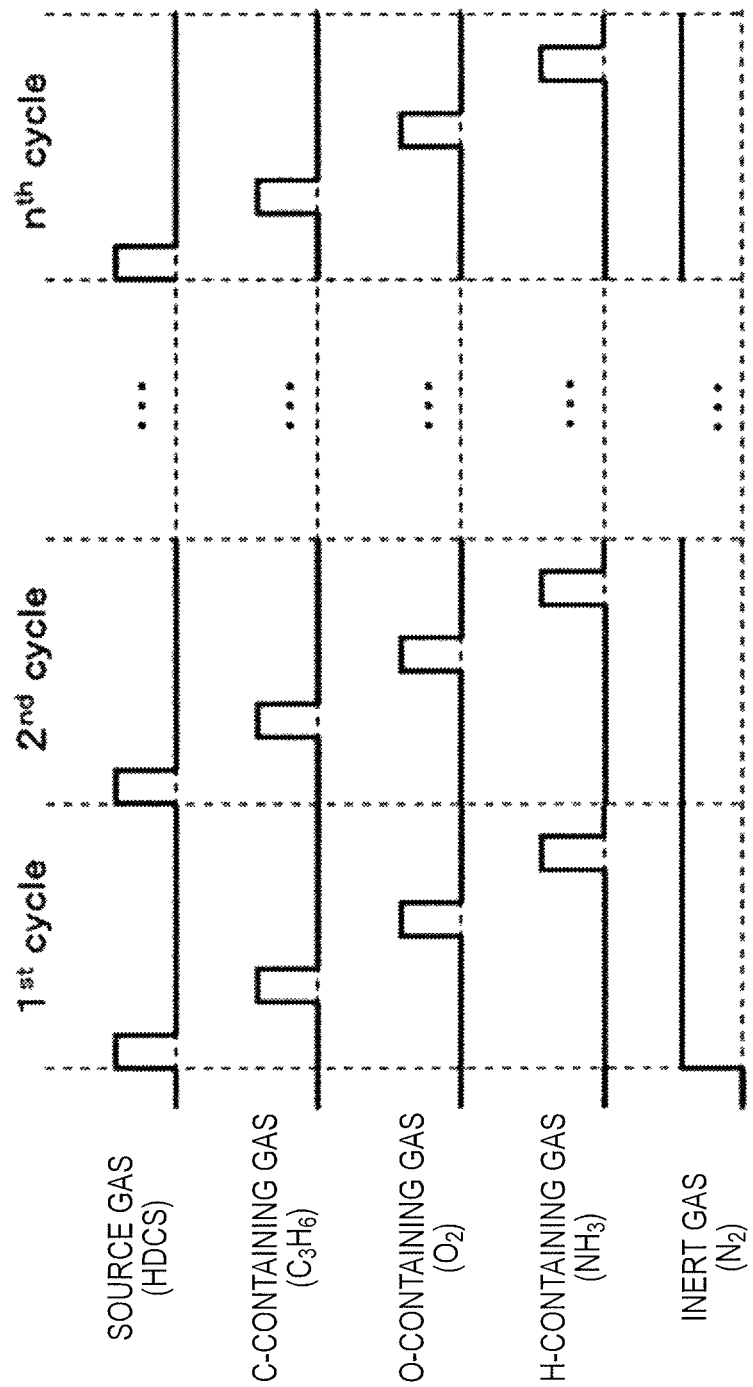
FIG. 9 is a diagram illustrating a film-forming sequence appropriately used for the embodiment of the present invention.

In addition, in the film-forming sequence illustrated in FIG. 9, as an example, a film containing Si, O, C, and N, that is, a silicon oxycarbonitride film (SiOCN film) is formed on the wafer 200 by performing a predetermined number of times (n times) of a cycle of non-simultaneously, that is, without synchronization performing:

a step 1 of supplying HCDS gas to the wafer 200 in the processing chamber 201 through the nozzle 249a;

a step 2 of supplying $C_3H_6$ gas to the wafer 200 in the processing chamber 201 through the nozzle 249a;

a step 3 of supplying $O_2$ gas to the wafer 200 in the processing chamber 201 through the nozzle 249b; and a step 4 of supplying $NH_3$ gas to the wafer 200 in the processing chamber 201 through the nozzle 249b. In addition, the SiOCN film may also be referred to as a C-containing silicon oxynitride film (SiON film), a C-added (doped) SiON film, or a C-containing SiON film.

In this specification, for the convenience, the film-forming sequence illustrated in FIG. 9 may be expressed as follows. In addition, it is assumed that the same expressions are used for description of the later-described modified examples or other embodiments.

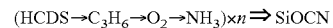

$(HCDS \rightarrow C_3H_6 \rightarrow O_2 \rightarrow NH_3) \times n \Rightarrow SiOCN$ In this specification, in some cases, the case of using the term "wafer" may include the case of denoting a "wafer itself" and the case of denoting a "stacked body (aggregate)

of a wafer and predetermined layers, films, or the like formed on a surface thereof". Namely, a wafer including predetermined layers, films, or the like formed on a surface thereof may be referred to as a wafer. In addition, in this specification, in some cases, the case of using the phrase "surface of a wafer" may include the case of denoting a "surface (exposed surface) of a wafer itself" or the case of denoting a "surface of a predetermined layer, film, or the like formed on a wafer, that is, an uppermost surface of a wafer as a stacked body".

Therefore, in this specification, in some cases, the case of expressing the phrase "to supply a predetermined gas to a wafer" may include the case of denoting "to directly supply a predetermined gas to a surface (exposed surface) of a wafer itself" or the case of denoting "to supply a predetermined gas to a layer, film, or the like formed on a wafer, that is, to an uppermost surface of a wafer as a stacked body". In addition, in this specification, in some cases, the case of expressing the phrase "to form a predetermined layer (or film) on a wafer" may include the case of denoting "to directly form a predetermined layer (or film) on a surface (exposed surface) of a wafer itself" or the case of denoting "to form a predetermined layer (or film) on a layer or film formed on a wafer, that is, on an uppermost surface of a wafer as a stacked body".

In addition, in this specification, the case of using the term "substrate" is the same as the case of using the term "wafer", and in this case, it may be considered that a "wafer" is replaced with a "substrate" in the above description.

(Wafer Charging and Boat Loading)

The plural wafers 200 are charged into the boat 217 (wafer charging). After that, as illustrated in FIG. 1, the boat 217 supporting the plural wafers 200 is lifted up by the boat elevator 115 and is loaded into the processing chamber 201 (boat loading). In this state, the seal cap 219 is in the state that the seal cap seals the lower end of the reaction tube 203 through the O-ring 220.

(Pressure Regulation and Temperature Adjustment)

Vacuum evacuation (pressure reducing evacuation) is performed by the vacuum pump 246 so that the processing chamber 201, that is, the space where the wafer 200 exists is at a desired pressure (degree of vacuum). At this time, the pressure of the processing chamber 201 is measured by the pressure sensor 245, and the APC valve 244 is feedback controlled based on the measured pressure information. The vacuum pump 246 maintains the state that the vacuum pump is operated at all the time at least until the process for the wafer 200 is ended. In addition, the wafer 200 in the processing chamber 201 is heated by the heater 207 so as to be at a desired temperature. At this time, the state of electric conduction to the heater 207 is feedback controlled based on temperature information detected by the temperature sensor 263 so that the processing chamber 201 has a desired temperature distribution. The heating of the processing chamber 201 by the heater 207 continues to be performed at least until the process for the wafer 200 is ended. In addition, rotation of the boat 217 and the wafer 200 by the rotation mechanism 267 is started. The rotation of the boat 217 and the wafer 200 by the rotation mechanism 267 continues to be performed at least until the process for the wafer 200 is ended.

(SiOCN Film Forming Process)

Next, the subsequent four steps, that is, steps 1 to 4 are sequentially performed.

[Step 1]

In this step, the HCDS gas is supplied to the wafer 200 in the processing chamber 201.

The valve 243a is opened, and the HCDS gas is flowed in the gas supply pipe 232a. The flow rate of the HCDS gas is regulated by the MFC 241a, is supplied to the processing chamber 201 through the nozzle 249a, and is exhausted from the exhaust pipe 231. At this time, the HCDS gas is supplied to the wafer 200. At the same time, the valve 243c is opened, the $N_2$ gas is flowed in the gas supply pipe 232c. The flow rate of the $N_2$ gas is regulated by the MFC 241c, is supplied together with the HCDS gas to the processing chamber 201, and is exhausted from the exhaust pipe 231.

In addition, in order to prevent the HCDS gas from intruding into the nozzle 249b, the valve 243d is opened, and the $N_2$ gas is flowed in the gas supply pipe 232d. The $N_2$ gas is supplied to the processing chamber 201 through the gas supply pipe 232b and the nozzle 249b and is exhausted from the exhaust pipe 231.

The supply flow rate of the HCDS gas controlled by the MFC 241a is set, for example, to be a flow rate in a range of 1 to 2000 sccm, preferably 10 to 1000 sccm. Each of the supply flow rates of the $N_2$ gas controlled by the MFCs 241c and 241d is set, for example, to be a flow rate in a range of 100 to 10000 sccm. The pressure of the processing chamber 201 is set, for example, to be a pressure in a range of 1 to 2666 Pa, preferably 67 to 1333 Pa. The time of supplying the HCDS gas to the wafer 200, that is, the gas supply time (irradiation time) is set, for example, to be a time in a range of 1 to 120 seconds, preferably 1 to 60 seconds. The temperature of the heater 207 is set to a temperature so that the temperature of the wafer 200 is, for example, a temperature in a range of 250 to 700° C., preferably 300 to 650° C., more preferably 350 to 600° C.

If the temperature of the wafer 200 is less than 250° C., the HCDS is less likely to be chemically adsorbed on the wafer 200, and in some cases, a practical deposition rate cannot be obtained. By setting the temperature of the wafer 200 to be 250° C. or more, this problem can be solved. By setting the temperature of the wafer 200 to be 300° C. or more or to be 350° C. or more, the HCDS can be more sufficiently adsorbed on the wafer 200, and a more sufficient deposition rate can be obtained.

If the temperature of the wafer 200 exceeds 700° C., the CVD reaction becomes too strong (excessive gas phase reaction occurs). Therefore, the film thickness uniformity is likely to be deteriorated, and the control thereof is difficult. By setting the temperature of the wafer 200 to be 700° C. or less, a proper gas phase reaction can be induced. Therefore, the deterioration of the film thickness uniformity can be suppressed, and the control thereof can be performed. Particularly, by setting the temperature of the wafer 200 to be 650° C. or less or 600° C. or less, the surface reaction dominates the gas phase reaction. Therefore, the film thickness uniformity is easily secured, and the control thereof is facilitated.

Therefore, the temperature of the wafer 200 may be set to be a temperature in a range of 250 to 700° C., preferably 300 to 650° C., more preferably 350 to 600° C.

By supplying the HCDS gas to the wafer 200 under the above-described conditions, as the first layer, for example, a Si-containing layer containing Cl having a thickness of from a thickness less than that of a one-atom layer to a thickness of a several-atom layer is formed on the uppermost surface of the wafer 200. The Si-containing layer containing Cl may be a Si layer containing Cl, may be an HCDS adsorbing layer, or may include both thereof.

The Si layer containing Cl is a general term including a continuous layer being configured with Si and containing Cl, a discontinuous layer, and a Si thin film containing Cl obtained by overlapping the above layers. In some cases, the continuous layer being configured with Si and containing Cl may be called a Si thin film containing Cl. The Si constituting the Si layer containing Cl includes Si of which bond to Cl is completely disconnected besides Si of which bond to Cl is not completely disconnected.

The HCDS adsorbing layer also includes a discontinuous adsorbing layer besides a continuous adsorbing layer configured with HCDS molecules. Namely, the HCDS adsorbing layer includes an adsorbing layer having a thickness of a one-molecule layer configured with HCDS molecules or an adsorbing layer having a thickness less than that of the one-molecule layer. The HCDS molecules constituting the HCDS adsorbing layer also include molecules where a portion of bonds with Si and Cl is disconnected. Namely, the HCDS adsorbing layer may be a physical adsorbing layer of the HCDS, may be a chemical adsorbing layer of the HCDS, or may include both thereof.

Herein, a layer having a thickness less than that of a one-atom layer denotes a discontinuously formed atom layer, and a layer having a thickness of a one-atom layer denotes a continuously formed atom layer. A layer having a thickness less than that of a one-molecule layer denotes a discontinuously formed molecule layer, and a layer having a thickness of a one-molecule layer denotes a continuously formed molecule layer. The Si-containing layer containing Cl may include both of the Si layer containing Cl and the HCDS adsorbing layer. However, as described above, the Si-containing layer containing Cl is expressed by using expression such as "one-atom layer", "several-atom layer", or the like.

Under the condition that the HCDS gas is self-decomposed (thermally decomposed), that is, under the condition that a thermal decomposition reaction of the HCDS gas occurs, Si is deposited on the wafer 200, so that the Si layer containing Cl is formed. Under the condition that the HCDS gas is not self-decomposed (thermally decomposed), that is, under the condition that the thermal decomposition reaction of the HCDS gas does not occur, the HCDS is adsorbed on the wafer 200, so that the HCDS adsorbing layer is formed. The formation of the Si layer containing Cl on the wafer 200 is preferred in comparison with the formation of the HCDS adsorbing layer on the wafer 200 in terms that the film-forming rate can be increased.

If the thickness of the first layer exceeds a thickness of a several-atom layer, the function of the reformation in the later-described steps 3 and 4 does not reach the entire first layer. In addition, the minimum value of the thickness of the first layer is less than a thickness of a one-atom layer. Therefore, the thickness of the first layer is preferably in a range from a thickness less than a one-atom layer to a thickness of a several-atom layer. By setting the thickness of the first layer to be a thickness of a one-atom layer or less, that is, to a thickness of a one-atom layer or a thickness less than that of a one-atom layer, the function of the reforming reaction in the later-described steps 3 and 4 can be relatively increased, and the time required for the reforming reaction in steps 3 and 4 can be shortened. The time required for the formation of the first layer in step 1 can also be shortened. As a result, the processing time per cycle can be shortened, and thus, the total processing time can also be shortened. Namely, it is possible to increase the film-forming rate. In addition, by setting the thickness of the first layer to be a thickness of a one-atom layer or less, it is possible to improve the controllability of the film thickness uniformity.

After the first layer is formed, the valve 243a is closed, so that the supply of the HCDS gas is stopped. At this time, the APC valve 244 is maintained opened, so that the processing chamber 201 is vacuum-exhausted by the vacuum pump 246, and the unreacted HCDS gas remaining in the processing chamber 201 or the HCDS gas after being contributed to the formation of the first layer is exhausted from the processing chamber 201. At this time, the valves 243c and 243d are maintained opened, so that the supply of the $N_2$ gas to the processing chamber 201 is maintained. The $N_2$ gas functions as a purging gas, and thus, the effect of exhausting a gas remaining in the processing chamber 201 from the processing chamber 201 can be improved.

At this time, the gas remaining in the processing chamber 201 may not be completely exhausted, and the processing chamber 201 may not be completed purged. If the gas remaining in the processing chamber 201 is very small, no adverse effect occurs in step 2 performed subsequently. There is no need to set the flow rate of the $N_2$ gas supplied to the processing chamber 201 to be a large flow rate, and for example, by supply the $N_2$ gas of which amount is approximately equal to the volume of the reaction tube 203 (processing chamber 201), the purging can be performed to such an extent that no adverse effect occurs in step 2. In this manner, the processing chamber 201 is not completely purged, so that the purge time is shortened, and it is possible to improve the throughput. It is possible to suppress the consumption of the $N_2$ gas to a necessary minimum.

As the source gas, besides the HCDS gas, an inorganic-based halosilane source gas such as OCTS gas, dichlorosilane ($SiH_2Cl_2$, abbreviation: DCS) gas, monochlorosilane ($SiH_3Cl$, abbreviation: MCS) gas, tetrachlorosilane, that is, silicon tetrachloride ($SiCl_4$, abbreviation: STC) gas, or trichlorosilane ($SiHCl_3$, abbreviation: TCS) gas may be used.

In addition, as the source gas, an organic-based halosilane source gas such as BTCSE gas, BTCSM gas, TCDMDS gas, DCTMDS gas, or MCPMDS gas can be used.

In addition, as the source gas, a halogen group-free inorganic-based silane source gas such as monosilane ($SiH_4$, abbreviation: MS) gas, disilane ($Si_2H_6$, abbreviation: DS) gas, or trisilane ($Si_3H_8$, abbreviation: TS) gas may be used.

In addition, as the source gas, a halogen group-free organic-based silane source gas such as dimethylsilane ($SiC_2H_8$, abbreviation: DMS) gas, trimethylsilane ($SiC_3H_{10}$, abbreviation: TMS) gas, diethylsilane ($SiC_4H_{12}$, abbreviation: DES) gas, or 1,4-disilabutane ($Si_2C_2H_{10}$, abbreviation: DSB) gas may be used.

In addition, as the source gas, a halogen group-free amino-based (amine-based) silane source gas such as trisdimethyl aminosilane ($Si[N(CH_3)_2]_3H$, abbreviation: 3DMAS) gas, tetrakisdimethyl aminosilane ($Si[N(CH_3)_2]_4$, abbreviation: 4DMAS) gas, bisdiethyl aminosilane ($Si[N(C_2H_5)_2]_2H_2$, abbreviation: BDEAS) gas, or bis tertiarybutylaminosilane ($SiH_2[NH(C_4H_9)]_2$, abbreviation: BTBAS) gas may be used.

In addition, in the case of using an organic-based halosilane source gas or an organic-based silane source gas functioning as a C source as the source gas, C can be allowed to be included in the first layer. As a result, the C concentration in the SiOCN film finally formed on the wafer 200 can be increased in comparison with the case of using an inorganic-based halosilane source gas or an inorganic-based silane source gas as the source gas. In addition, in the case of using an amino-based silane source gas functioning as a C source and an N source as the source gas, C and N can be allowed to be included in the first layer. As a result, the C concentration and the N concentration in the SiOCN film finally formed on the wafer 200 can be increased respectively in comparison with the case of using an inorganic-based silane source gas as the source gas.

As the inert gas, besides the $N_2$ gas, for example, a rare gas such as Ar gas, He gas, Ne gas, or Xe gas may be used.

[Step 2]

After step 1 is ended, the $C_3H_6$ gas which is activated by heat is supplied to the wafer 200 in the processing chamber 201, that is, the first layer formed on the wafer 200.

In this step, the control of opening and closing of the valves 243a, 243c, and 243d is performed in the same procedure as that of the control of opening and closing of the valves 243a, 243c, and 243d in step 1. The flow rate of the $C_3H_6$ gas is regulated by the MFC 241a, is supplied to the processing chamber 201 through the nozzle 249a, and is exhausted from the exhaust pipe 231. At this time, the $C_3H_6$ gas is supplied to the wafer 200.

The supply flow rate of the $C_3H_6$ gas controlled by the MFC 241a is set, for example, to be a flow rate in a range of 100 to 10000 sccm. The pressure of the processing chamber 201 is set, for example, to be a pressure in a range of 1 to 5000 Pa, preferably 1 to 4000 Pa. The partial pressure of the $C_3H_6$ gas in the processing chamber 201 is set, for example, to be a pressure in a range of 0.01 to 4950 Pa. By setting the pressure of the processing chamber 201 to be in such a relatively high pressure range, the $C_3H_6$ gas can be thermally activated in a non-plasma manner. The $C_3H_6$ gas that is activated by heat to be supplied can induce a relatively soft reaction, so that the later-described C-containing layer formation is facilitated. The time of supplying the $C_3H_6$ gas to the wafer 200, that is, the gas supply time (irradiation time) is set, for example, to be a time in a range of 1 to 200 seconds, preferably 1 to 120 seconds, more preferably 1 to 60 seconds. The other process conditions are set, for example, to be the same as the process conditions of step 1.

At this time, the gas being flowed in the processing chamber 201 is the thermally activated $C_3H_6$ gas, and the HCDS gas is not flowed in the processing chamber 201. Therefore, the $C_3H_6$ gas does not induce a gas phase reaction and is supplied to the wafer 200 in an activated state. As a result, a carbon-containing layer (C-containing layer) is formed on the first layer formed on the wafer 200 in step 1, that is, on the surface of the Si-containing layer containing Cl. The C-containing layer may be a C layer, may be a $C_3H_6$ adsorbing layer, or may include both thereof. The C-containing layer becomes a layer having a thickness less than that of a one-molecule layer or a thickness less than that of a one-atom layer, that is, a discontinuous layer. For example, in a case where the $C_3H_6$ adsorbing layer is formed as the C-containing layer, a chemical adsorbing layer of the molecules constituting the $C_3H_6$ is formed in an unsaturated state. Therefore, a second layer containing Si, Cl, and C is formed on the uppermost surface of the wafer 200. The second layer is a layer including a Si-containing layer containing Cl and a C-containing layer. In addition, in some cases, according to the condition, a portion of the first layer and the $C_3H_6$ gas react with each other, and thus, the first layer is reformed (carbonized), so that the SiC layer is included in the second layer.

The C-containing layer needs to be configured as a discontinuous layer. If the C-containing layer is configured as a continuous layer, the entire surface of the Si-containing layer containing Cl is covered with the C-containing layer. In this case, Si does not exist on the surface of the second layer, and as a result, in some cases, the oxidizing reaction of the second layer in the later-described step 3 or the nitriding reaction of the third layer in the later-described step 4 is not easily performed. This is because, under the above-described process condition, O or N bonds to Si, but O or N does not easily bond to C. In order to induce a desired reaction in the later-described step 3 or 4, the adsorption state of the C-containing layer, for example, a chemical adsorbing layer of the $C_3H_6$ on the Si-containing layer containing Cl is allowed to be an unsaturated state, and thus, Si needs to be in the state that Si is exposed to the surface of the second layer. In addition, by setting the process condition in step 2 to be a process condition within the above-described process condition range, it is possible to allow the C-containing layer to be a discontinuous layer.

After the second layer is formed, the valve 243a is closed, so that the supply of the $C_3H_6$ gas is stopped. Next, by the same process procedure and process condition as those of step 1, the unreacted $C_3H_6$ gas remaining in the processing chamber 201, the $C_3H_6$ gas after being contributed to the formation of the C-containing layer, or the reaction by-products is exhausted from the processing chamber 201. At this time, similarly to step 1, the gas remaining in the processing chamber 201 and the like may not be completely exhausted.

As the C-containing gas, besides the $C_3H_6$ gas, a hydrocarbon-based gas such as acetylene ($C_2H_2$) gas or ethylene ($C_2H_4$) gas may be used.

As the inert gas, besides the $N_2$ gas, for example, various types of the rare gases exemplified in step 1 may be used.

[Step 3]

After step 2 is ended, the $O_2$ gas which is activated by heat is supplied to the wafer 200 in the processing chamber 201, that is, the second layer formed on the wafer 200.

In this step, the control of opening and closing of the valves 243b to 243d is performed in the same procedure as that of the control of opening and closing of the valves 243a, 243c, and 243d in step 1. The flow rate of the $O_2$ gas is regulated by the MFC 241b, is supplied to the processing chamber 201 through the nozzle 249b, and is exhausted from the exhaust pipe 231. At this time, the $O_2$ gas is supplied to the wafer 200.

The supply flow rate of the $O_2$ gas controlled by the MFC 241b is set, for example, to be a flow rate in a range of 100 to 10000 sccm. The pressure of the processing chamber 201 is set, for example, to be a pressure in a range of 1 to 4000 Pa, preferably 1 to 3000 Pa. The partial pressure of the $O_2$ gas in the processing chamber 201 is set, for example, to be a pressure in a range of 0.01 to 3960 Pa. By setting the pressure of the processing chamber 201 to be in such a relatively high pressure range, the $O_2$ gas can be thermally activated in a non-plasma manner. The $O_2$ gas that is activated by heat to be supplied can induce a relatively soft reaction, so that the later-described oxidation can be softly performed. The time of supplying the $O_2$ gas to the wafer 200, that is, the gas supply time (irradiation time) is set, for example, to be a time in a range of 1 to 120 seconds, preferably 1 to 60 seconds. The other process conditions are set, for example, to be the same as the process conditions of step 1.

At this time, the gas being flowed in the processing chamber 201 is the thermally activated $O_2$ gas, and the HCDS gas and the $C_3H_6$ gas are not flowed in the processing chamber 201. Therefore, the $O_2$ gas does not induce a gas phase reaction and is supplied to the wafer 200 in an activated state. The $O_2$ gas supplied to the wafer 200 reacts with at least a portion of the second layer containing Si, Cl, and C (layer including the Si-containing layer containing Cl and the C-containing layer) formed on the wafer 200 in step 2. Therefore, the second layer is thermally oxidized in a non-plasma manner to be changed (reformed) into the third layer containing Si, O, and C, that is, the silicon oxycarbide layer (SiOC layer). In addition, when the third layer is formed, impurities such as Cl contained in the second layer constitute a gaseous material containing at least Cl in the process of the reforming reaction by the $O_2$ gas and is exhausted from the processing chamber 201. Namely, the impurities such as Cl in the second layer are extracted from the second layer or are desorbed, so that the impurities are separated from the second layer. Therefore, the third layer becomes a layer having a smaller number of the impurities such as Cl than the second layer.

At this time, the oxidizing reaction of the second layer is allowed not to be saturated. For example, in a case where the Si-containing layer containing Cl having a thickness of a several-atom layer is formed in step 1, and the C-containing layer having a thickness less than that of a one-atom layer is formed in step 2, at least a portion of the surface layer (one-atom layer of the surface) is oxidized. In this case, so as not to oxidize the entire second layer, the oxidation is performed under the condition that the oxidizing reaction of the second layer is unsaturated. In addition, although several layers underlying the surface layer of the second layer may be oxidized according to the condition, the oxidizing of the only surface layer is preferred because the controllability of the composition ratio of the SiOCN film finally formed on the wafer 200 can be improved. In addition, for example, in a case where the Si-containing layer containing Cl having a thickness of a one-atom layer or a thickness less than that of a one-atom layer is formed in step 1, and the C-containing layer having a thickness less than that of a one-atom layer is formed in step 2, similarly, a portion of the surface layer is oxidized. Even in this case, the oxidation is performed under the condition that the oxidizing reaction of the second layer is unsaturated so that the entire second layer is not oxidized. In addition, by setting the process condition in step 3 to be a process condition within the above-described process condition range, it is possible to allow the oxidizing reaction of the second layer to be unsaturated.

In addition, at this time, particularly, the above-described process condition may be adjusted so that the dilution ratio of the $O_2$ gas is increased (concentration is decreased), the supply time of the $O_2$ gas is shortened, or the partial pressure of the $O_2$ gas is decreased. For example, in comparison with steps 2 and 4, the dilution ratio of the reaction gas may be increased, the supply time of the reaction gas may be shortened, or the partial pressure of the reaction gas may be decreased. Therefore, the oxidizing power in step 3 can be appropriately reduced, so that unsaturation of the oxidizing reaction of the second layer is further facilitated.

By reducing the oxidizing power in step 3, in the oxidizing process, it is possible to suppress desorption of C from the second layer. Since the bonding energy of the Si—O bond is higher than that of the Si—C bond, if the Si—O bond is formed, there is a tendency that the Si—C bond is disconnected. Therefore, by appropriately reducing the oxidizing power in step 3, when the Si—O bond is formed in the second layer, it is possible to suppress the disconnection of the Si—C bond, and thus, it is possible to suppress the desorption of the C of which bond to the Si is disconnected from the second layer.

In addition, by reducing the oxidizing power in step 3, the state that Si is exposed to the uppermost surface of the oxidized second layer, that is, the third layer can be retained. The state that Si is exposed to the uppermost surface of the third layer is retained, so that in the later-described step 4, the nitridation of the uppermost surface of the third layer is facilitated. In the state that the Si—O bond or the Si—C bond is formed over the entire uppermost surface of the third layer, and thus, the Si is not exposed to the uppermost surface, there is a tendency that the Si—N bond is not easily formed under the condition of the later-described step 4. However, the state that Si is exposed to the uppermost surface of the third layer is retained, namely, Si capable of bonding with N under the conditions of the later-described step 4 is allowed to exist on the uppermost surface of the third layer, so that the formation of the Si—N bond is facilitated.

After the third layer is formed, the valve 243b is closed, so that the supply of the $O_2$ gas is stopped. Next, by the same process procedure and process conditions as those of step 1, the unreacted $O_2$ gas remaining in the processing chamber 201, the $O_2$ gas after being contributed to the formation of the third layer, or the reaction by-products is exhausted from the processing chamber 201. At this time, similarly to step 1, the gas remaining in the processing chamber 201 and the like may not be completely exhausted.

As the oxidizing gas, besides the $O_2$ gas, an O-containing gas such as water vapor ($H_2O$ gas), nitric oxide (NO) gas, nitrous oxide ($N_2O$) gas, nitrogen dioxide ($NO_2$) gas, carbonmonoxide (CO) gas, carbon dioxide ($CO_2$) gas, or ozone ($O_3$) gas may be used.

As the inert gas, besides the $N_2$ gas, for example, various types of the rare gases exemplified in step 1 may be used.

[Step 4]

After step 3 is ended, the $NH_3$ gas which is activated by heat is supplied to the wafer 200 in the processing chamber 201, that is, the third layer formed on the wafer 200.

In this step, the control of opening and closing of the valves 243b to 243d is performed in the same procedure as the control of opening and closing of the valves 243a, 243c, and 243d in step 1. The flow rate of the $NH_3$ gas is regulated by the MFC 241b, is supplied to the processing chamber 201 through the nozzle 249b, and is exhausted from the exhaust pipe 231. At this time, the $NH_3$ gas is supplied to the wafer 200.

The supply flow rate of the $NH_3$ gas controlled by the MFC 241b is set, for example, to be a flow rate in a range of 100 to 10000 sccm. The pressure of the processing chamber 201 is set, for example, to be a pressure in a range of 1 to 4000 Pa, preferably 1 to 3000 Pa. The partial pressure of the $NH_3$ gas in the processing chamber 201 is set, for example, to be a pressure in a range of 0.01 to 3960 Pa. By setting the pressure of the processing chamber 201 to be in such a relatively high pressure range, the $NH_3$ gas can be thermally activated in a non-plasma manner. The $NH_3$ gas that is activated by heat to be supplied can induce a relatively soft reaction, so that the later-described nitridation can be softly performed. The time of supplying the $NH_3$ gas to the wafer 200, that is, the gas supply time (irradiation time) is set, for example, to be a time in a range of 1 to 120 seconds, preferably 1 to 60 seconds. The other process conditions are set, for example, to be the same as the process conditions of step 1.

At this time, the gas being flowed in the processing chamber 201 is the thermally activated $NH_3$ gas, and the HCDS gas, the $C_3H_6$ gas, and the $O_2$ gas are not flowed in the processing chamber 201. Therefore, the $NH_3$ gas does not induce a gas phase reaction and is supplied to the wafer 200 in an activated state. The $NH_3$ gas supplied to the wafer 200 reacts with at least a portion of the third layer (SiOC layer) formed on the wafer 200 in step 3. Therefore, the third layer is thermally nitrided in a non-plasma manner to be changed (reformed) into a fourth layer containing Si, O, C, and N, that is, the silicon oxycarbonitride layer (SiOCN layer). In addition, when the fourth layer is formed, impurities such as Cl contained in the third layer constitute a gaseous material containing at least Cl in the process of the reforming reaction by the $NH_3$ gas and is exhausted from the processing chamber 201. Namely, the impurities such as Cl in the third layer are extracted from the third layer or are desorbed, so that the impurities are separated from the third layer. Therefore, the fourth layer becomes a layer having a smaller number of the impurities such as Cl than the third layer.

In addition, by supplying the activated $NH_3$ gas to the wafer 200, the uppermost surface of the third layer is reformed in the process where the third layer is nitrided. After the surface reforming treatment is performed in the process of the nitriding, the uppermost surface of the third layer, that is, the uppermost surface of the fourth layer is in the surface state that, in step 1 performed in the next cycle, the HCDS is easily adsorbed and the Si is easily deposited. Namely, the $NH_3$ gas used in step 4 functions as an adsorption/deposition facilitating gas facilitating adsorption and deposition of the HCDS or the Si on the uppermost surface of the fourth layer (uppermost surface of the wafer 200).

At this time, the nitriding reaction of the third layer is allowed not to be saturated. For example, in a case where the third layer having a thickness of the several-atom layer is formed in steps 1 to 3, at least a portion of the surface layer thereof (one-atom layer of the surface) is nitrided. In this case, so as not to nitride the entire third layer, the nitridation is performed under the condition that the nitriding reaction of the third layer is unsaturated. In addition, although several layers underlying the surface layer of the third layer may be nitrided according to the condition, the nitriding of the only surface layer is preferred because the controllability of the composition ratio of the SiOCN film finally formed on the wafer 200. In addition, for example, in a case where the third layer having a thickness of a one-atom layer or a thickness less than that of a one-atom layer is formed in steps 1 to 3, similarly, a portion of the surface layer is nitrided. Even in this case, the nitridation is performed under the condition that the nitriding reaction of the third layer is unsaturated so that the entire third layer is not nitrided. In addition, by setting the process condition in step 4 to be the process condition within the above-described process condition range, it is possible to allow the nitriding reaction of the third layer to be unsaturated.

After the fourth layer is formed, the valve 243b is closed, so that the supply of the $NH_3$ gas is stopped. Next, by the same process procedure and process conditions as those of step 1, the unreacted $NH_3$ gas remaining in the processing chamber 201, the $NH_3$ gas after being contributed to the formation of the fourth layer, or the reaction by-products is exhausted from the processing chamber 201. At this time, similarly to step 1, the gas remaining in the processing chamber 201 and the like may not be completely exhausted.

As the nitriding gas, besides the $NH_3$ gas, a hydrogen nitride-based gas such as diazene ($N_2H_2$) gas, hydrazine ($N_2H_4$) gas, or $N_3H_8$ gas or a gas containing a compound thereof may be used.

As the inert gas, besides the $N_2$ gas, for example, various types of the rare gases exemplified in step 1 may be used.

(Performing Predetermined Number of Times)

The SiOCN film having a predetermined composition and a predetermined film thickness may be formed on the wafer 200 by performing a predetermined number of times (n times) of the cycle of performing the above-described four steps non-simultaneously, that is, without synchronization.

In addition, it is preferable that the above-described cycle is repeated in several times. Namely, it is preferable that the thickness of the fourth layer (SiOCN layer) formed by performing the above-described cycle once is allowed to be smaller than a desired film thickness, and the above-described cycle is repeated several times until the film thickness of the SiOCN film formed by laminating the fourth layer (SiOCN layer) becomes a desired film thickness.

(Purge and Return to Atmospheric Pressure)

After the formation of the SiOCN film is completed, the valves 243c and 243d are opened, so that the $N_2$ gas is supplied from the respective gas supply pipes 232c and 232d to the processing chamber 201 and is exhausted from the exhaust pipe 231. The $N_2$ gas functions as a purging gas. Therefore, the processing chamber 201 is purged, a gas or a reaction by-products remaining in the processing chamber 201 is removed (purged) from the processing chamber 201. After that, the atmosphere in the processing chamber 201 is replaced with an inert gas (inert gas replacement), and the pressure of the processing chamber 201 is returned to the normal pressure (atmospheric pressure return).

(Boat Unloading and Wafer Discharging)

The seal cap 219 is lifted down by the boat elevator 115, and thus, the bottom end of the reaction tube 203 is opened. Next, the processed wafer 200 is unloaded from the bottom end of the reaction tube 203 to the outside of the reaction tube 203 in the state that the wafer is supported by the boat 217 (boat unloading). The processed wafer 200 is discharged from the boat 217 (wafer discharging).

(3) Effects of Embodiment

According to the embodiment, it is possible to obtain one effect or plural effects described below.

(a) The nozzle distal end portion 271 is configured to have a U shape, so that it is possible to lengthen the heating time or the distance of the processing gas introduced into the gas supply nozzle, and it is possible to uniformly supply the activated processing gas to the wafer.

(b) The gas residence suppressing hole 280 is provided to the distal end of the nozzle 249, so that it is possible to suppress the residence of the processing gas in the distal end of the nozzle.

(c) The gas residence suppressing hole 280 is provided to the distal end of the nozzle 249, so that it is possible to suppress a decrease in gas flow velocity of the processing gas as it goes toward the distal end of the nozzle, and it is possible to uniformly supply the processing gas from the gas supply hole to the wafer.

(d) The gas residence suppressing hole 280 is provided to the distal end of the nozzle 249, so that it is possible to prevent by-products such as particles inside the nozzle 249 from being attached on the wafer 200.

(e) The hole diameter of the gas residence suppressing hole 280 is configured to be larger than that of the gas supply hole 250, so that it is possible to efficiently suppress the residence of the gas in the distal end of the nozzle.

(f) The hole diameter of the gas residence suppressing hole 280 is configured to have such a size that the flow velocity of the gas supplied to the most upstream of the upstream side pipe 271-1 is equal to the flow velocity of the gas supplied to the most downstream of the downstream side pipe 271-2, so that it is possible to prevent the supplied processing gas from being in the exhaust rate-controlling by the gas residence suppressing hole 280, and it is possible to uniformly supply the gas from the gas supply hole 250 to the wafer.

(Modified Example)

Figure 10A:
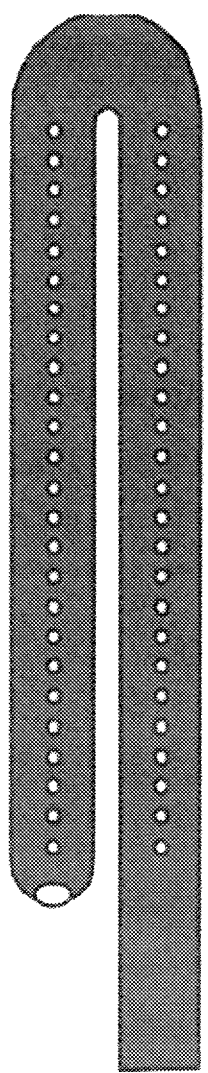
FIG. 10A is a diagram illustrating a case where the hole diameter of the gas residence suppressing hole in the nozzle distal end in the nozzle shape of FIG. 5 is set to $\phi 4$.
Figure 10B:
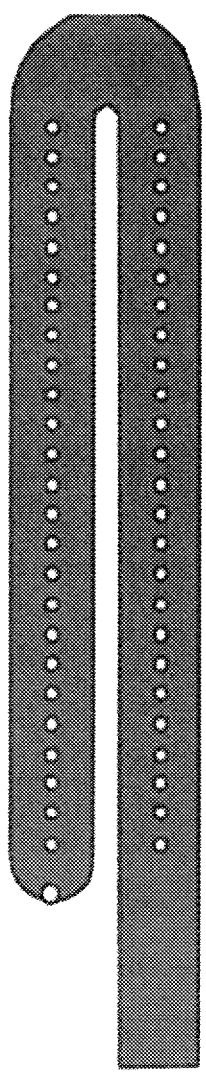
FIG. 10B is a diagram illustrating a case where the hole diameter of the gas residence suppressing hole in the nozzle distal end in the nozzle shape of FIG. 5 is set to $\phi 1.1$.
Figure 10C:
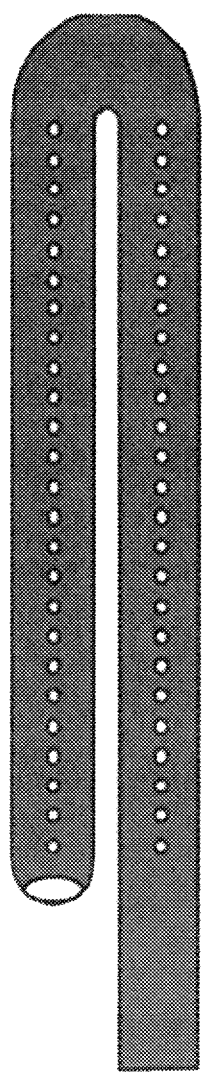
FIG. 10C is a diagram illustrating a case where the hole diameter of the gas residence suppressing hole in the nozzle distal end in the nozzle shape of FIG. 5 is set to $\phi 8$.

Next, modified Examples of the present invention will be described with reference to FIGS. 10A to 10C. As illustrated in FIGS. 10A, 10B, and 10C, the gas supply holes 250 are provided to both of the upstream side pipe 271-1 and the downstream side pipe 271-2 of the nozzle 249, and as illustrated in FIG. 10D, the gas supply holes 250 are provided to only the downstream side pipe 271-2, and thus, the processing gas activated by heating is easily supplied on the wafer 200, so that it is possible to obtain the effect that it is possible to improve the inter-plane film thickness uniformity between the wafers.

In addition, as illustrated in FIG. 10E, the gas supply holes 250 are provided to only the upstream side pipe 271-1, and thus, even in a case where by-products such as particles inside the nozzle occur, since the gas supply holes 250 are not provided to the downstream side pipe 271-2, it is possible to obtain the effect that it is possible to easily exhaust the by-products such as particles to an exhaust direction.

In addition, as illustrated in FIGS. 10F and 10G, the installation heights of the gas supply holes 250 provided to the upstream side pipe 271-1 and the downstream side pipe 271-2 are formed to be different from each other, so that it is possible to obtain the effect that it is possible to uniformly supply the activated processing gas to the wafer 200. Namely, as illustrated in FIG. 10F, the gas supply holes 250 are provided, so that in a height-direction central portion of the upstream side pipe 271-1 and a height-direction central portion of the downstream side pipe 271-2, the activated processing gas can be easily supplied. Therefore, a large amount of the processing gas can be supplied to the vicinity of the central portion of the wafer arrangement region, and thus, the invention can be effectively used for a case where the reaction of the processing gas in the vicinity of the central portion of the wafer arrangement region is bad. Furthermore, as illustrated in FIG. 10G, the gas supply holes 250 are provided, so that in the vicinity of the highest position or the lowest position of the wafer arrangement region, the activated processing gas can be easily supplied. Therefore, the invention can be effectively used for a case where the reaction of the processing gas in the vicinity of the highest position or the lowest position of the wafer arrangement region is bad.

In addition, as illustrated in FIGS. 10H to 10K, by extending the length of the downstream side pipe 271-2, the gas residence suppressing hole 280 is provided to as low a portion as possible in the vertical direction, so that it is possible to prevent by-products such as particles from being attached on the wafer 200. In this case, it is preferable that the gas residence suppressing hole 280 is provided to a position lower than the region where the wafer 200 is supported. Namely, by extending the length of the downstream side pipe 271-2, the gas residence suppressing hole 280 is formed so as to be located in an insulating region below the region where the wafer 200 is supported, and thus, the gas residence suppressing hole 280 can be arranged in the vicinity of the exhaust outlet, so that the gas containing by-products such as particles can be exhausted in the vicinity of the exhaust outlet. Therefore, even in a case where by-products such as particles occur inside the nozzle 249 due to peeling of the deposited film or the like, the gas exhausted from the gas residence suppressing hole 280 is immediately exhausted from the exhaust outlet of the exhaust pipe 231, so that it is possible to prevent the by-products such as particles from being attached on the wafer 200.

Figure 10H:
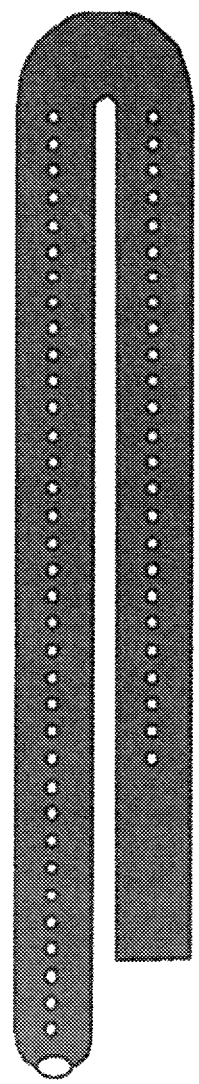
FIG. 10H is a diagram illustrating a case where the hole diameter of the gas residence suppressing hole in the nozzle distal end in the nozzle shape of FIG. 5 is set to φ4, a length of the nozzle at the downstream side from the folded portion of the nozzle is large, and an installation position of gas supply hole at the downstream side from the folded portion of the nozzle is located in a lower portion of the reaction tube.
Figure 10I:
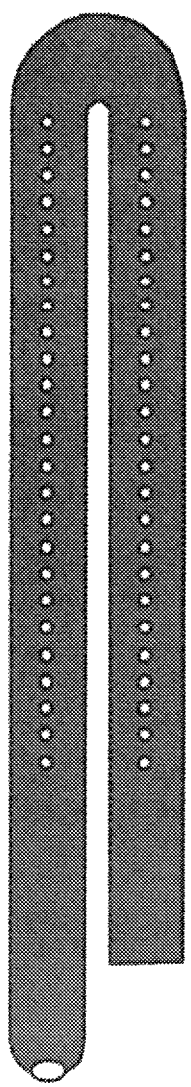
FIG. 10I is a diagram illustrating a case where the hole diameter of the gas residence suppressing hole in the nozzle distal end in the nozzle shape of FIG. 5 is set to φ4, the length of the nozzle at the downstream side from the folded portion of the nozzle is large, and the installation positions of gas supply holes at the upstream and downstream from the folded portion of the nozzle are located at the same height.
Figure 10J:
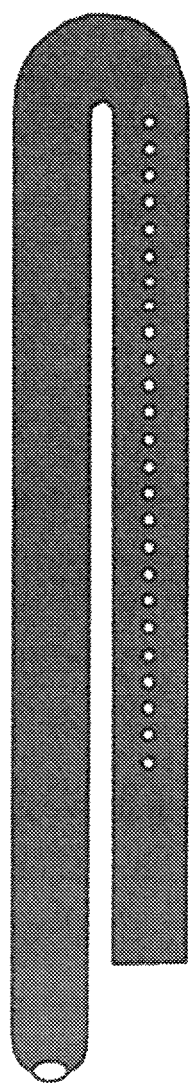
FIG. 10J is a diagram illustrating a case where the hole diameter of the gas residence suppressing hole in the nozzle distal end in the nozzle shape of FIG. 5 is set to φ4, the length of the nozzle at the downstream side from the folded portion of the nozzle is large, and gas supply holes are provided to only the upstream side from the folded portion of the nozzle.
Figure 10K:
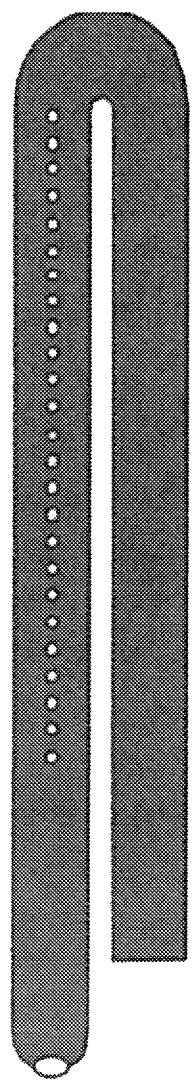
FIG. 10K is a diagram illustrating a case where the hole diameter of the gas residence suppressing hole in the nozzle distal end in the nozzle shape of FIG. 5 is set to φ4, the length of the nozzle at the downstream side from the folded portion of the nozzle is large, and gas supply holes are provided to only the downstream side from the folded portion of the nozzle.

In addition, as illustrated in FIG. 10H, if the gas supply holes 250 are formed so as to be arranged also in the insulating region, an etching gas can be directly supplied to the insulating region at the time of cleaning a processing chamber by supplying the etching gas, and thus, it is possible to efficiently remove the deposited film which is deposited in the insulating region.

<Second Embodiment>

Figure 11:
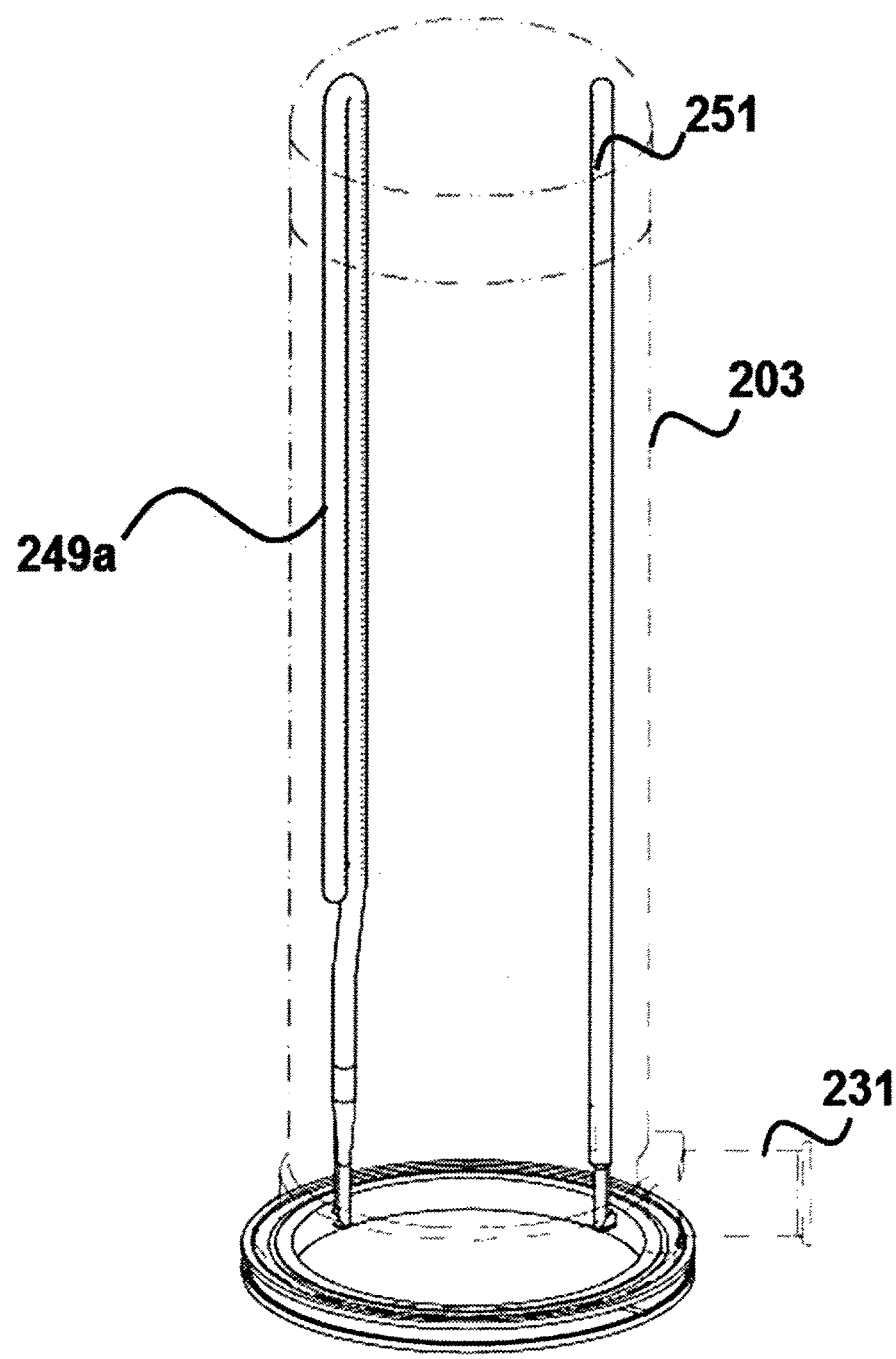
FIG. 11 is a diagram illustrating an installation example of a process container and nozzles in a substrate processing apparatus appropriately used for another embodiment of the present invention.

Next, a second embodiment of the present invention will be described with reference to FIGS. 11 and 12. A substrate processing apparatus according to the second embodiment is different from that of the first embodiment in that, as illustrated in FIG. 11, the nozzle 249a supplying the source gas is arranged as a U-shaped nozzle, and instead of the nozzle 249b illustrated in FIGS. 1 and 2, a nozzle supplying the reaction gas or the inert gas is arranged as a straight-pipe-type nozzle 251. The other configurations are the same as those of the first embodiment.

Figure 12:
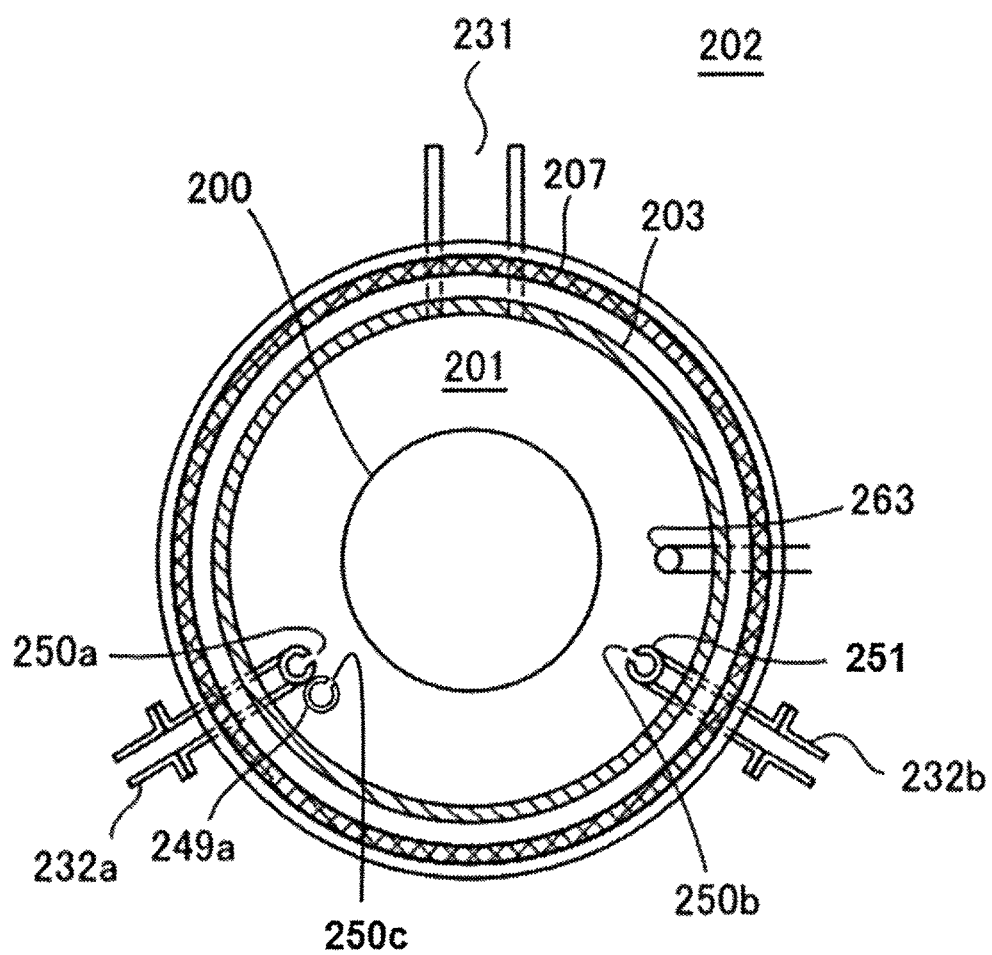
FIG. 12 is a schematic configuration diagram illustrating a vertical processing furnace in the substrate processing apparatus appropriately used for another embodiment of the present invention and is a cross-sectional diagram of the processing furnace portion taken along line A-A of FIG. 11.

In addition, as illustrated in FIG. 12, only the nozzle 249a supplying a source gas which needs to be activated by heating is arranged as a U-shaped nozzle, so that it is possible to facilitate maintenance, and it is possible to reduce device cost.

By the configuration according to the second embodiment, it is possible to obtain the following effects.

(g) The number of U-shaped nozzles of which structure is complicated is decreased, so that it is possible to facilitate device maintenance.

(h) The number of U-shaped nozzles of which structure is complicated is decreased, so that it is possible to reduce device cost.

<Other Embodiments>

Heretofore, the embodiments of the present invention were described specifically. However, the present invention is not limited to the above-described embodiments, but various changes are available within the scope without departing from the spirit of the present invention, and the effects thereof can be obtained.

For example, in the first embodiment of the present invention, a case where the same nozzles are used as the nozzles 249a and 249b is described, but the present invention is not limited thereto. The nozzle illustrated in FIG. 10C may be used as the nozzle 249a, the nozzle illustrated in FIG. 10E may be used as the nozzle 249b, and the installation positions of the gas supply holes may be different between the nozzles 249a and 249b.

In addition, for example, as described below, in the film-forming sequence in the embodiment, the to-be-formed films can be changed by changing the types of the supplied gases or the supply timing thereof.

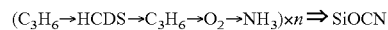

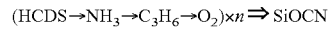

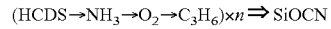

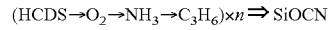

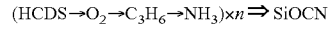

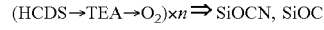

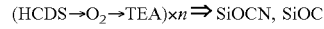

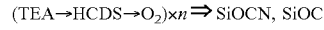

(HCDS→H₂→O₂)×n ⇒ SiO (HCDS→O₂→H₂)×n ⇒ SiO (H₂→HCDS→O₂)×n ⇒ SiO (HCDS→NH₃→O₂)×n ⇒ SiON (HCDS→O₂→NH₃)×n ⇒ SiON (NH₃→HCDS→O₂)×n ⇒ SiON (HCDS→H₂+O₂→NH₃)×n ⇒ SiON

Like these modified examples, a reaction gas is arbitrarily selected to be used, or a supply order of a source gas and a reaction gas is arbitrarily changed, so that composition, composition ratio, film quality, or the like of a to-be-formed film can be changed. In addition, plural kinds of the reaction gases may be used in a form of an arbitrary combination thereof. For example, the NH₃ gas, the TEA gas, or the HCDS gas may be added (mixed) with the C₃H₆ gas in use. Therefore, a composition, a composition ratio, a film quality, or the like of a to-be-formed film can be changed.

The silicon-based insulating film formed by the film-forming sequence illustrated in FIG. 9 or by each modified example is used as a sidewall spacer, so that it is possible to provide a device forming technique having a small leak current and an excellent processability. In addition, the above-described silicon-based insulating film is used as an etching stopper, so that it is possible to provide a device forming technique having an excellent processability. In addition, according to the film-forming sequence illustrated in FIG. 9 or each modified example, it is possible to form a silicon-based insulating film with an ideal stoichiometric ratio without using plasma. Since the silicon-based insulating film can be formed without using plasma, the present invention can be applied to a process of forming, for example, an SADP film of DPT or the like which may cause a concern about plasma damage.

In addition, in the above-described modified examples, in the step of supplying the TEA gas which is activated by heat to the wafer 200, the supply flow rate of the TEA gas controlled by the MFC 241b is set, for example, to be a flow rate in a range of 100 to 10000 sccm. The pressure of the processing chamber 201 is set, for example, to be a pressure in a range of 1 to 5000 Pa, preferably 1 to 4000 Pa. In addition, the partial pressure of the TEA gas in the processing chamber 201 is set, for example, to be a pressure in a range of 0.01 to 4950 Pa. The time of supplying the TEA gas to the wafer 200, that is, the gas supply time (irradiation time) is set, for example, to be a time in a range of 1 to 200 seconds, preferably 1 to 120 seconds, more preferably 1 to 60 seconds. The other process conditions are set, for example, to be the same as the process conditions of step 4 of the film-forming sequence illustrated in FIG. 9. As the gas containing N, C, and H, beside the TEA gas, for example, an ethylamine-based gas such as diethylamine ((C₂H₅)₂NH, abbreviation: DEA) gas or monoethylamine (C₂H₅NH₂, abbreviation: MEA) gas, a methylamine-based gas such as trimethylamine ((CH₃)₃N, abbreviation: TMA) gas, dimethylamine ((CH₃)₂NH, abbreviation: DMA) gas, or monomethylamine (CH₃NH₂, abbreviation: MMA) gas, or the like may be used.

The process procedure and process condition of the other steps may be set, for example, to be the same as the process procedure and process condition of each step in the film-forming sequence illustrated in FIG. 9.

In addition, the film-forming sequence described in the above-described exemplary embodiment may be appropriately applied to even the case of forming an oxide film containing a metal element such as titanium (Ti), zirconium (Zr), hafnium (Hf), tantalum (Ta), niobium (Nb), aluminum (Al), molybdenum (Mo), or tungsten (W), that is, a metal-based oxide film on the wafer 200. Namely, the above-described film-forming sequence can also be appropriately applied to the case of forming a TiOCN film, a TiOC film, a TiON film, a TiO film, a ZrOCN film, a ZrOC film, a ZrON film, a ZrO film, a HfOCN film, a HfOC film, a HfON film, an HfO film, a TaOCN film, a TaOC film, a TaON film, a TaO film, an NbOCN film, an NbOC film, an NbON film, an NbO film, an AlOCN film, an AlOC film, an AlON film, an AlO film, an MoOCN film, an MoOC film, an MoON film, an MoO film, a WOCN film, a WOC film, a WON film, or a WO film on the wafer 200.

In the case of forming a metal-based oxide film, as a source gas, for example, an inorganic metal source gas containing a metal element and a halogen element such as a titanium tetrachloride (TiCl₄) gas, a titanium tetrafluoride (TiF₄) gas, a zirconium tetrachloride (ZrCl₄) gas, a zirconium tetrafluoride (ZrF₄) gas, a hafnium tetrachloride (HfCl₄) gas, a hafnium tetrafluoride (HfF₄) gas, a tantalum pentachloride (TaCl₅) gas, a tantalum pentafluoride (TaF₅) gas, a niobium pentachloride (NbCl₅) gas, a niobium pentafluoride (NbF₅) gas, an aluminum trichloride (AlCl₃) gas, an aluminum trifluoride (AlF₃) gas, a molybdenum pentachloride (MoCl₅) gas, a molybdenum pentafluoride (MoF₅) gas, a tungsten hexachloride (WCl₆) gas, or a tungsten hexafluoride (WF₆) gas may be used. In addition, as the source gas, for example, an organic metal source gas containing a metal element and carbon such as a trimethyl aluminum (Al(CH₃)₃, abbreviation: TMA) gas may be used. As a reaction gas, the same as those of the above-described embodiment may be used.

For example, by the film-forming sequence described hereinafter, a TiON film or TiO film may be formed on the wafer 200.

(TiCl₄→NH₃→O₃)×n ⇒ TiON, TiO (TiCl₄→O₃→NH₃)×n ⇒ TiON, TiO (NH₃→TiCl₄→O₃)×n ⇒ TiON, TiO

Namely, the present invention can be appropriately applied to the case of forming a film containing predetermined elements such as semiconductor elements or metal elements. Even in the case of performing the film forming, the film forming can be performed in the same process conditions as those of the above-described embodiments, so that it is possible to obtain the same effects as those of the above-described embodiments.

It is preferable that recipes (programs where process procedures or process conditions are written) used for the substrate process are individually prepared according to contents of process (film types, composition ratios, film qualities, film thicknesses, process procedures, process conditions, and the like of films which are to be formed on a substrate) and are stored in the memory device 121c through an electric communication line or the external memory device 123. It is preferable that, when starting various processes, the CPU 121a appropriately selects a proper recipe according to the contents of the process among plural recipes stored in the memory device 121c. Therefore, films having various film types, composition ratios, film qualities, and film thicknesses can be allowed to be formed with good reproducibility by one substrate processing apparatus. In addition, the burden of the operator (burden of inputting of the process procedure, the process condition, and the like) can be reduced, so that it is possible to avoid manipulation mistake, and it is possible to quickly start the substrate process.

The above-described process recipe is not limited to a case where the recipe is newly produced, but for example, an existing recipe which is installed in advance in the substrate processing apparatus may be modified to be prepared. In the case of modifying the recipe, the modified recipe may be installed in the substrate processing apparatus through an electric communication line or a recording medium where the recipe is recorded. In addition, by manipulating the input/output device 122 included in the existing substrate processing apparatus, an existing recipe installed in advance in the substrate processing apparatus may be allowed to be directly modified.

In the above-described embodiments, the examples of forming films by using a substrate processing apparatus having a hot-wall-type processing furnace were described. The present invention is not limited to the above-described embodiments, but the present invention can be appropriately applied to even the case of forming films by using a substrate processing apparatus having a cold-wall-type processing furnace.

Even in the case of using such a substrate processing apparatus, film-forming can be performed in the same sequence and process conditions as those of the above-described embodiments or modified examples so that it is possible to obtain the same effects as those of the above-described embodiments or modified examples.

The above-described embodiments and modified examples may be used in a form of an appropriate combination thereof. In addition, the process conditions of the case are set, for example, to be the same as the process conditions of the above-described embodiments or modified examples.

What is claimed is:

1. A gas supply nozzle comprising:
   a nozzle base end portion, including a gas supply pipe and an extending pipe connected to the gas supply pipe so as to form a L-shape;
   a nozzle distal end portion, including an upstream side pipe connected to a downstream end of the extending pipe, a folded portion connected to a downstream end of the upstream side pipe and a downstream side pipe connected to a downstream end of the folded portion, a folding direction in the folded portion crossing a longitudinal direction of the gas supply pipe;
   a set of a plurality of gas supply holes, disposed at a side surface of the upstream side pipe or the downstream side pipe, the set of the plurality of gas supply holes turning to the longitudinal direction of the gas supply pipe; and
   a gas residence suppressing hole, disposed at a downstream bottom end of the downstream side pipe, for flowing a gas to the longitudinal direction of the downstream side pipe.

2. The gas supply nozzle according to claim 1, wherein hole diameter of the gas residence suppressing hole is 1.1 times to 25 times larger than hole diameters of the plurality of gas supply holes.

3. The gas supply nozzle according to claim 1, wherein a hole diameter of the gas residence suppressing hole is larger than a diameter of the plurality of gas supply holes, and smaller than a pipe diameter of the downstream side pipe.

4. The gas supply nozzle according to claim 1, wherein a hole diameter of the gas residence suppressing hole is configured so as to be in a range of 1/90 times or more and less than 1 times a nozzle diameter of the nozzle distal end portion.

5. The gas supply nozzle according to claim 1, wherein a hole diameter of the gas residence suppressing hole is configured so as to be in a range of 0.05 times or more and less than 1 times a distal end area of the nozzle distal end portion.

6. The gas supply nozzle according to claim 1, wherein a hole diameter of the gas residence suppressing hole is configured so that a flow velocity at an upstream side of the upstream side pipe is substantially equal to a flow velocity at a downstream side of the downstream side pipe.

7. The gas supply nozzle according to claim 3, wherein the set of the plurality of gas supply holes are provided to both of the upstream side pipe and the downstream side pipe.

8. The gas supply nozzle according to claim 7, wherein a height of the set of the plurality of gas supply holes disposed to the upstream side pipe is differ from a height of the set of the plurality of gas supply holes disposed to the downstream side pipe, partly.

9. The gas supply nozzle according to claim 1, wherein the downstream side pipe has a plurality of gas residence suppressing holes, each gas residence suppressing hole is disposed at a downstream bottom end of the downstream side pipe, for flowing the gas to the longitudinal direction of the downstream side pipe, respectively.

10. The gas supply nozzle according to claim 9, wherein a gross area of the plurality of gas residence suppressing holes is larger than an opening area of the plurality of gas supply holes, and smaller than a cross-sectional area of the downstream side pipe.

11. The gas supply nozzle according to claim 9, wherein a gross area of a plurality of gas residence suppressing holes is configured so that a flow velocity at an upstream side of the upstream side pipe is substantially equal to a flow velocity at a downstream side of the downstream side pipe.

12. A substrate processing apparatus comprising:
   a heater having a cylindrical shape, being vertically installed;
   a reaction tube installed inside the heater;
   a processing chamber formed in a cylindrical hollow portion of the reaction tube, the processing chamber having an exhaust outlet of an exhaust pipe at lower position of the processing chamber;
   a boat supporting a plurality of substrates to be in a horizontal posture and to be arranged in a vertical direction;
   a controller configured to control forming a film on each surface of the plurality of substrates, respectively; and
   a first gas supply system including:
   a first nozzle base end portion, including a first gas supply pipe penetrating a lower side wall of the reaction tube horizontally, and a first extending pipe connected to a downstream end of the first gas supply pipe so as to stand vertically in the reaction tube;
   a first nozzle distal end portion, including a first upstream side pipe connected to an downstream end of the first extending pipe, a first folded portion connected to an downstream end of the first upstream side pipe and a first downstream side pipe connected to a downstream end of the first folded portion, a folding direction in the first folded portion crossing a longitudinal direction of the first gas supply pipe;

a first set of a plurality of first gas supply holes, disposed at a side surface of the first upstream side pipe or the first downstream side pipe, the first set of a plurality of gas supply holes being directed to a center of the reaction tube; and a first gas residence suppressing hole, disposed at a downstream bottom end of the first downstream side pipe, for flowing a gas to a longitudinal direction of the downstream side pipe.

13. The substrate processing apparatus according to claim 12, wherein the first gas residence suppressing hole is provided to a position lower than a region where the substrates are supported, and arranged in a vicinity of the exhaust outlet of an exhaust pipe.

14. The substrate processing apparatus according to claim 13, wherein an upstream end of the first gas supply pipe is connected to a source gas supply system for supplying a source gas to the processing chamber, the source gas is at least one selected from the group consisting of an inorganic-based halosilane source gas, an organic-based halosilane source gas, a halogen group-free inorganic-based silane source gas, a halogen group-free organic-based silane source gas, and a halogen group-free amino-based (amine-based) silane source gas.

15. The substrate processing apparatus according to claim 14, further comprising:

a second gas supply system including:
  a second nozzle base end portion, including a second gas supply pipe penetrating a lower side wall of the reaction tube horizontally, and a second extending pipe connected to a downstream end of the second gas supply pipe so as to stand vertically in the reaction tube;
  a second nozzle distal end portion, including a second upstream side pipe connected to an downstream end of the second extending pipe, a second folded portion connected to an downstream end of the second upstream side pipe and a second downstream side pipe connected to a downstream end of the second folded portion, a folding direction in the second folded portion crossing a longitudinal direction of the second gas supply pipe;
  a second set of a plurality of second gas supply holes, disposed at a side surface of the second upstream side pipe or the second downstream side pipe, the second set of a plurality of gas supply holes being directed the center of the reaction tube;
  a second gas residence suppressing hole, disposed at a downstream bottom end of the second downstream side pipe, for flowing a gas to a longitudinal direction of the downstream side pipe; and
  a reaction gas or an inert gas supply system, connected to an upstream end of the second gas supply pipe, the reaction gas being at least one selected from the group consisting of a carbon containing gas, an oxygen containing gas, a hydrogen containing gas, a nitrogen containing gas, and a hydrogen nitride-based gas.

16. The substrate processing apparatus according to claim 14, further comprising:

a third gas supply system including:
  a third nozzle base end portion, including a third gas supply pipe penetrating a lower side wall of the reaction tube horizontally, and a third extending pipe connected to a downstream end of the third gas supply pipe so as to stand vertically in the reaction tube;
  a straight-pipe-type nozzle, connected to an downstream end of the third extending pipe, the straight-pipe-type nozzle having a plurality of third gas supply holes, disposed at a side surface of the straight-pipe-type nozzle; and
  a reaction gas or an inert gas supply system, connected to an upstream end of the third gas supply pipe, the reaction gas being at least one selected from the group consisting of a carbon containing gas, an oxygen containing gas, a hydrogen containing gas, a nitrogen containing gas, and a hydrogen nitride-based gas.

17. The substrate processing apparatus according to claim 15, wherein the controller configured to control composition or quality of a film formed on each surface of the plurality of substrates, by performing following steps:
(1) supplying the source gas through the first gas supply system; and
(2) supplying the reaction gas through the second gas supply system.

18. The substrate processing apparatus according to claim 16, wherein the controller configured to control composition or quality of a film formed on each surface of the plurality of substrates, by performing following steps:
(1) supplying the source gas through the first gas supply system; and
(2) supplying the reaction gas through the third gas supply system.

19. A gas supply nozzle comprising:

an upstream side pipe for introducing a gas;
a folded portion connected to an downstream end of the upstream side pipe, for reversing a flowing direction of the gas;
a downstream side pipe connected to a downstream end of the folded portion;
a set of a plurality of gas supply holes, disposed at a side surface of the upstream side pipe or the downstream side pipe, the set of a plurality of gas supply holes turning to a direction crossing the folding direction; and
a gas residence suppressing hole, disposed at a downstream bottom end of the downstream side pipe, for flowing the gas to a longitudinal direction of the downstream side pipe,
wherein a gross area of the gas residence suppressing holes is larger than an opening area of the plurality of gas supply holes, and smaller than the cross-sectional area of the downstream side pipe.

* * * * *